United States Patent
Choi et al.

(10) Patent No.: US 12,504,690 B2
(45) Date of Patent: Dec. 23, 2025

(54) APPARATUS FOR TREATING SUBSTRATE AND METHOD FOR TREATING A SUBSTRATE

(71) Applicant: SEMES CO., LTD., Cheonan-si (KR)

(72) Inventors: Ki Hoon Choi, Cheonan-si (KR); In Ki Jung, Hwaseong-si (KR); Hyo Won Yang, Seoul (KR); Sang Hyeon Ryu, Yangpyeong-gun (KR); Young Ho Park, Incheon (KR); Tae Hee Kim, Yongin-si (KR)

(73) Assignee: Semes Co., Ltd., Chungcheongnam-do (KR)

( * ) Notice: Subject to any disclaimer, the term of this patent is extended or adjusted under 35 U.S.C. 154(b) by 404 days.

(21) Appl. No.: 18/059,675

(22) Filed: Nov. 29, 2022

(65) Prior Publication Data
US 2023/0168586 A1 Jun. 1, 2023

(30) Foreign Application Priority Data

Nov. 30, 2021 (KR) .......... 10-2021-0168235

(51) Int. Cl.
*G03F 7/16* (2006.01)
*G03F 7/00* (2006.01)

(52) U.S. Cl.
CPC .......... *G03F 7/162* (2013.01); *G03F 7/70525* (2013.01); *G03F 7/70808* (2013.01); *G03F 7/7085* (2013.01); *G03F 7/709* (2013.01)

(58) Field of Classification Search
None
See application file for complete search history.

(56) References Cited

U.S. PATENT DOCUMENTS

2022/0310417 A1* 9/2022 Nakamura ........ H01L 21/67109

FOREIGN PATENT DOCUMENTS

| | | |
|---|---|---|
| JP | 2010-060385 A | 3/2010 |
| JP | 2014-209605 A | 11/2014 |
| KR | 10-2000-0031299 A | 6/2000 |
| KR | 10-2015-0109260 A | 10/2015 |
| KR | 10-2016-0107034 A | 9/2016 |
| KR | 10-1935692 | 1/2019 |
| KR | 10-2019-0037379 A | 4/2019 |
| KR | 10-2019-0037479 A | 4/2019 |
| KR | 10-2020-0124641 A | 11/2020 |
| KR | 10-2021-0071135 A | 6/2021 |

OTHER PUBLICATIONS

KR 20190037379 A machine translation, Substrate Treating Apparatus and Substrate Treating Method, Kim (Year: 2019).*
Korean Office Action dated Aug. 27, 2024 issued in corresponding Korean Patent Application No. 10-2021-0168235.

* cited by examiner

*Primary Examiner* — Cristi J Tate-Sims
(74) *Attorney, Agent, or Firm* — Harness, Dickey & Pierce, P.L.C.

(57) ABSTRACT

The inventive concept provides a substrate treating apparatus. The substrate treating apparatus includes a housing having a treating space; a support unit configured to support and rotate a substrate at the treating space; a liquid supply unit configured to supply a liquid to a substrate supported on the support unit; a post-treating unit configured to perform a post-treatment on the substrate supported on the support unit; and a monitoring unit configured to inspect a state of a liquid film formed of the liquid supplied onto the substrate.

16 Claims, 22 Drawing Sheets

APPARATUS FOR TREATING SUBSTRATE AND METHOD FOR TREATING A SUBSTRATE

CROSS-REFERENCE TO RELATED APPLICATIONS

A claim for priority under 35 U.S.C. § 119 is made to Korean Patent Application No. 10-2021-0168235 filed on Nov. 30, 2021, in the Korean Intellectual Property Office, the entire contents of which are hereby incorporated by reference.

BACKGROUND

Embodiments of the inventive concept described herein relate to a substrate treating apparatus and a substrate treating method.

A photolithography process for forming a pattern on a wafer includes an exposing process. The exposing process is an operation which is previously performed for cutting a semiconductor integrated material attached to the wafer into a desired pattern. The exposing process may have various purposes such as forming a pattern for an etching and forming a pattern for the ion implantation. In the exposing process, the pattern is drawn in on the wafer with a light using a mask, which is a kind of 'frame'. When the light is exposed to the semiconductor integrated material on the wafer, for example, a resist on the wafer, chemical properties of the resist change according to a pattern by the light and the mask. When a developing liquid is supplied to a resist which chemical properties have changed according to the pattern, the pattern is formed on the wafer.

In order to precisely perform the exposing process, the pattern formed on the mask must be precisely manufactured. It must be confirmed whether the pattern is formed to satisfy the required process condition. A large number of patterns are formed on one mask. Therefore, it takes a lot of time for the operator to inspect all of the large number of patterns to inspect one mask.

Accordingly, a monitoring pattern capable of representing one pattern group including a plurality of patterns is formed on the mask. In addition, an anchor pattern that may represent a plurality of pattern groups are formed on the mask. The operator may estimate whether patterns included in one pattern group are good or not through an inspecting of the monitoring pattern. Also, the operator may estimate whether patterns formed on the mask are good or not through an inspecting of the anchor pattern.

Also, in order to increase an accuracy of the mask inspection, it is preferable that critical dimension of the monitoring pattern and the anchor pattern are the same.

A critical dimension correction process for precisely correcting the critical dimension of patterns formed on the mask is additionally performed.

FIG. 1 illustrates a normal distribution regarding a first critical dimension CDP1 of the monitoring pattern of the mask and a second critical dimension CDP2 (a critical dimension of the anchor pattern) before a critical dimension correction process is performed during a mask manufacturing process. In addition, the first critical dimension CDP1 and the second critical dimension CDP2 have a size smaller than a target critical dimension. Before the critical dimension correction process is performed, there is a deliberate deviation between the critical dimension of the monitoring pattern and the anchor pattern (CD, critical dimension). And, by additionally etching the anchor pattern in the critical dimension correction process, the critical dimension of these two patterns are made the same. In the process of overetching the anchor pattern, if the anchor pattern is more over-etched than the monitoring pattern, a difference in the critical dimension of the monitoring pattern and the anchor pattern occurs, and thus the critical dimension of the patterns formed at the mask may not be accurately corrected. When additionally etching the anchor pattern, a precise etching with respect to the anchor pattern should be accompanied.

In the process of etching the anchor pattern, a treating liquid is supplied to the wafer, and the anchor pattern formed on the wafer to which the treating liquid is supplied is heated using laser light. In order for a precise etching to be accompanied with respect to the anchor pattern, the treating liquid supplied on the wafer must form a uniform liquid film. The liquid film formed on the wafer should be formed to have a certain thickness or greater. For example, the liquid film formed on the wafer should be formed higher than a height of the patterns formed on the wafer.

If the laser light is irradiated to a region on a liquid film having less than a certain thickness to be heat-treated, the heat treatment is performed even in a part at which the liquid film does not exist, causing a damage to the pattern formed on the wafer. In addition, even if a uniform liquid film is formed on the wafer more than a certain thickness, if the vibration is transmitted to the liquid film, there is a risk that the liquid film may break due to a formation of a boundary surface in the liquid film. Accordingly, if the laser light is irradiated to the wafer at which the liquid film is formed because the liquid film is not uniformly formed, a change in a refractive angle of the laser light is caused, reducing an etching accuracy.

SUMMARY

Embodiments of the inventive concept provide a substrate treating apparatus and method for performing a precise etching with respect to a substrate.

Embodiments of the inventive concept provide a substrate treating apparatus and method for monitoring a state of an inkdrop formed on a substrate.

Embodiments of the inventive concept provide a substrate treating apparatus and method for forming a uniform inkdrop on a substrate.

The technical objectives of the inventive concept are not limited to the above-mentioned ones, and the other unmentioned technical objects will become apparent to those skilled in the art from the following description.

The inventive concept provides a substrate treating apparatus. The substrate treating apparatus includes a housing having a treating space; a support unit configured to support and rotate a substrate at the treating space; a liquid supply unit configured to supply a liquid to a substrate supported on the support unit; a post-treating unit configured to perform a post-treatment on the substrate supported on the support unit; and a monitoring unit configured to inspect a state of a liquid film formed of the liquid supplied onto the substrate.

In an embodiment, the substrate treating apparatus further includes a controller for generating a control signal for performing a standby command for stopping a driving of the substrate treating apparatus, or a liquid retention command for supplying a liquid onto the substrate, according to a state of the liquid film detected by the monitoring unit.

In an embodiment, the monitoring unit includes a vision member for detecting a vibration of the liquid film among the state of the liquid film, by detecting a flow of the liquid at a surface of the liquid film.

In an embodiment, the vision member detects whether a boundary surface of the liquid film is generated at the surface of the liquid film, and further detects a breakage of the liquid film among the state of the liquid film.

In an embodiment, the controller generates a signal of the standby command to the support unit and the liquid supply unit so a rotation of the support unit and a liquid supply of the liquid supply unit is stopped for a set time, if the vision member detects the vibration of the liquid film.

In an embodiment, the controller generates the liquid retention command signal to the liquid supply unit so the liquid is supplied by the liquid supply unit to the substrate supported on the support unit during a set time, if the vision member detects the boundary surface of the liquid film.

In an embodiment, the liquid supply unit supplies the liquid to a set height from a top surface of the substrate supported on the support unit, and wherein the monitoring unit includes: a top light sensor positioned at a height corresponding to the set height, and which detects a thickness of the liquid film among the state of the liquid film; and a bottom light sensor positioned between the top surface of the substrate supported on the support unit and the set height, and which detects whether the liquid film is formed among the state of the liquid film, and wherein the controller generates the liquid retention command signal to the liquid supply unit so the liquid supply unit supplies the liquid to the substrate supported on the support unit so a thickness of the liquid film is formed to the set height, if the thickness of the liquid film detected by the top light sensor is below the set height.

In an embodiment, the monitoring unit includes a weight measuring member positioned within the support unit, and which detects a weight of the liquid supplied to the substrate supported on the support unit.

In an embodiment, the post treating unit is a heating unit for heating a substrate supplied with the liquid.

In an embodiment, the heating unit is an irradiation module for irradiating a laser light to the substrate supplied with the liquid.

The inventive concept provides a substrate treating apparatus for treating a mask having a plurality of cells. The substrate treating apparatus includes a support unit configured to support and rotate a mask having a first pattern formed within the plurality of cells and having a second pattern which is different from the first pattern formed outside a region at which the cells are formed; a liquid supply unit configured to supply a liquid to the mask supported on the support unit; an irradiation module for irradiating a laser light to the second pattern among the first pattern and the second pattern at which the liquid is supplied; a monitoring unit configured to inspect a state of a liquid film formed of a liquid supplied onto the mask, and a controller, and wherein the monitoring unit includes a vision member for detecting a vibration of the liquid film among the state of the liquid film, by detecting a flow of the liquid at a surface of the liquid film, and the controller generates a standby command for stopping a driving of the substrate treating apparatus, or a liquid retention command for supplying the liquid onto the mask, according to the state of the liquid film detected by the monitoring unit.

In an embodiment, the controller generates a signal of the standby command to the support unit and the liquid supply unit so a rotation of the support unit and a liquid supply of the liquid supply unit is stopped for a set time, if the vision member detects the vibration of the liquid film.

In an embodiment, the vision member detects whether a boundary surface of the liquid film is generated at the surface of the liquid film, and further detects a breakage of the liquid film among the state of the liquid film, and the controller generates the liquid retention command signal to the liquid supply unit so the liquid is supplied by the liquid supply unit to the mask supported on the support unit during a set time, if the vision member detects the boundary surface of the liquid film.

The inventive concept provides a substrate treating method. The substrate treating method includes supplying a treating liquid to a substrate; inspecting a state of a liquid film formed by the treating liquid supplied to the substrate; and performing a post treatment on the substrate at which the liquid film is formed after the inspecting.

In an embodiment, at the inspecting comprises detecting a vibration of the liquid film by detecting a flow of the treating liquid at a surface of the liquid film, and stopping a supply of the treating liquid to the substrate during a set time if the vibration of the liquid film is detected.

In an embodiment, the inspecting further comprises detecting whether a boundary surface of the liquid film is generated at the surface of the liquid film, and further supplying the treating liquid to the substrate during a set time if a breakage of the liquid film is detected.

In an embodiment, the inspecting further comprises detecting whether the liquid film is formed by a bottom light sensor installed at a height corresponding to a minimal thickness to form the liquid film.

In an embodiment, the supplying supplies the treating liquid to a set height from a top surface of the substrate, and the inspecting further comprises detecting a thickness of the liquid film formed by the treating liquid supplied to the set height by the top light sensor installed at a height corresponding to the set height, and further supplying the treating liquid to the substrate during a set time if the thickness of the liquid film which is detected is below the set height.

In an embodiment, the inspecting further comprises measuring a weight of the treating liquid supplied to the substrate, and detecting the state of the liquid film from the weight of the treating liquid which is measured.

In an embodiment, the substrate comprises a plurality of cells, and has a first pattern formed within the plurality of cells and a second pattern which is different from the first pattern formed outside a region at which the cells are formed, and wherein the performing the post treatment is irradiating a laser light to the second pattern among the first pattern and the second pattern to which the treating liquid is supplied.

According to an embodiment of the inventive concept, a substrate may perform a precise etching with respect to a substrate.

According to an embodiment of the inventive concept, a state of an inkdrop formed on a substrate may be monitored.

According to an embodiment of the inventive concept, a uniform inkdrop may be formed on a substrate.

The effects of the inventive concept are not limited to the above-mentioned ones, and the other unmentioned effects will become apparent to those skilled in the art from the following description.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
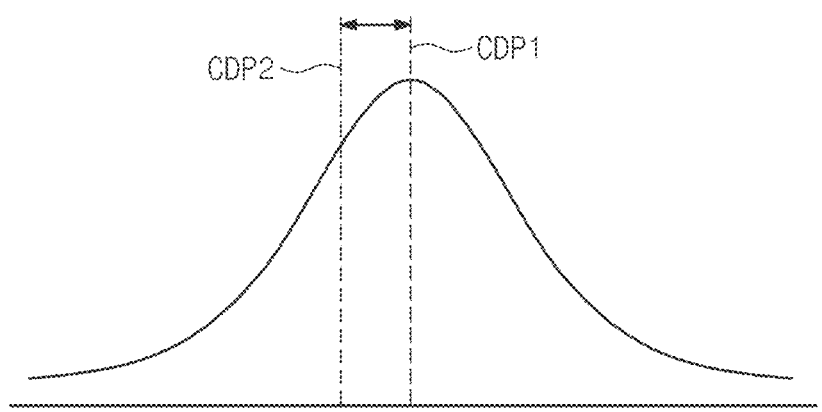
FIG. 1 illustrates a normal distribution of a critical dimension of a monitoring pattern and a critical dimension of an anchor pattern.

The inventive concept may be variously modified and may have various forms, and specific embodiments thereof will be illustrated in the drawings and described in detail. However, the embodiments according to the concept of the inventive concept are not intended to limit the specific disclosed forms, and it should be understood that the present inventive concept includes all transforms, equivalents, and replacements included in the spirit and technical scope of the inventive concept. In a description of the inventive concept, a detailed description of related known technologies may be omitted when it may make the essence of the inventive concept unclear.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Hereinafter, embodiments of the inventive concept will be described in detail with reference to the accompanying drawings.

Figure 2:
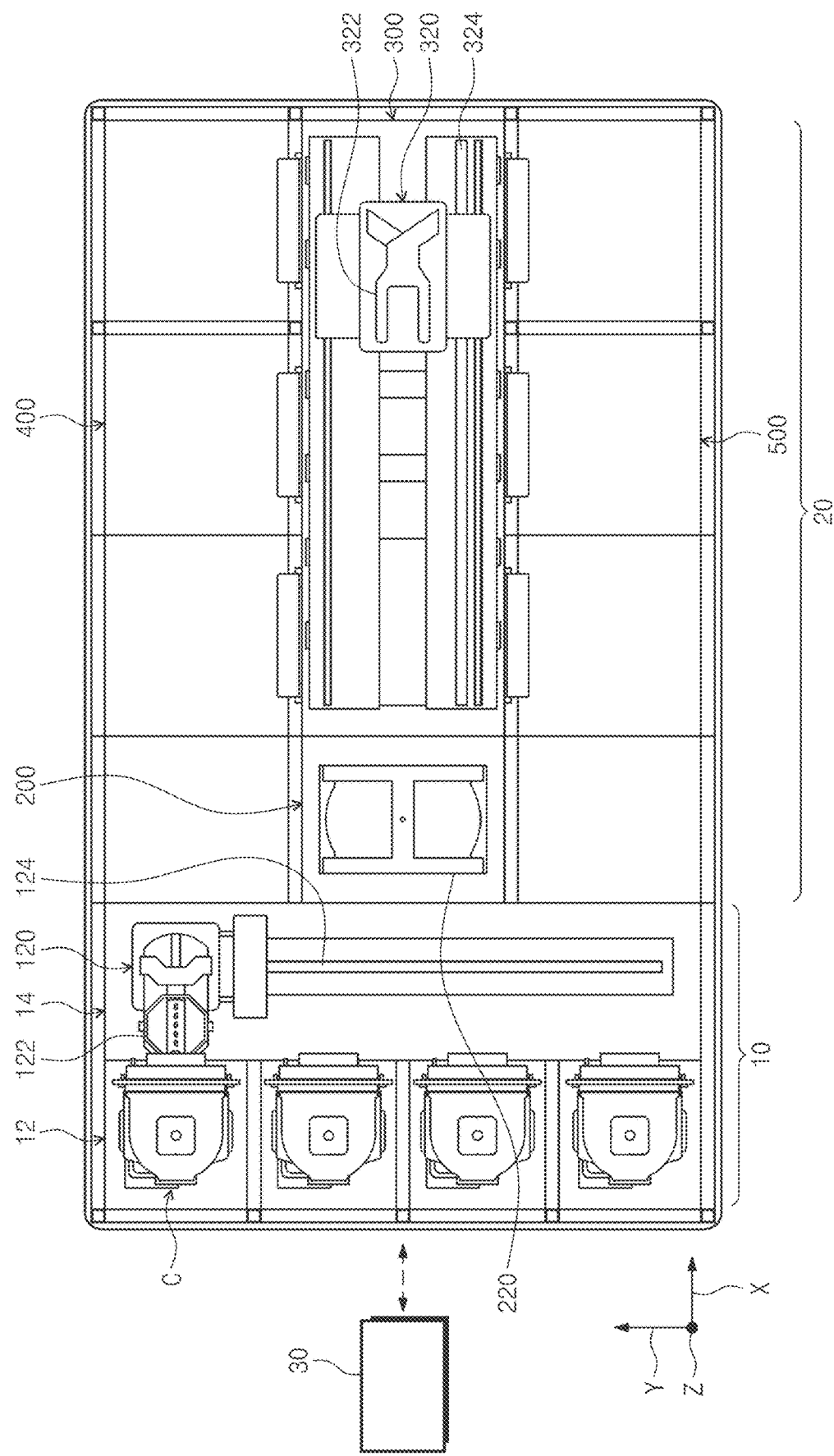
FIG. 2 is a plan view schematically illustrating a substrate treating apparatus according to an embodiment of the inventive concept.

Hereinafter, an embodiment of the inventive concept will be described in detail with reference to FIG. 2 to FIG. 24. FIG. 2 is a plan view schematically illustrating a substrate treating apparatus according to an embodiment of the inventive concept.

Referring to FIG. 2, the substrate treating apparatus includes an index module 10, a treating module 20, and a controller 30. According to an embodiment, when viewed from above, the index module 10 and the treating module 20 may be disposed along a direction.

Hereinafter, a direction in which the index module 10 and the treating module 20 are disposed is defined as a first direction X, a direction perpendicular to the first direction X when viewed from the front is defined as a second direction Y, and a direction perpendicular to a plane including both the first direction X and the second direction Y is defined as a third direction Z.

The index module 10 transfers a substrate M from a container C in which the substrate M is accommodated to the treating module 20 for treating the substrate M. The index module 10 stores a substrate M on which a preset treatment has been completed at the treating module 20 in the container C. A lengthwise direction of the index module 10 may be formed in the second direction Y. The index module 10 may have a load port 12 and an index frame 14.

The container C in which the substrate M is accommodated is seated on the load port 12. The load port 12 may be positioned on an opposite side of the treating module 20 with respect to the index frame 14. A plurality of load ports 12 may be provided, and the plurality of load ports 12 may be arranged in a line along the second direction Y. The number of load ports 12 may increase or decrease according to a process efficiency and foot print conditions, etc of the treating module 20.

As the container C, a sealing container such as a front opening unified pod (FOUP) may be used. The container C may be placed on the load port 12 by a transfer means (not shown) such as an overhead transfer, an overhead conveyor, or an automatic guided vehicle, or by an operator.

An index frame 14 provides a transfer space for transferring the substrate M. An index robot 120 and an index rail 124 may be provided at the index frame 14. The index robot 120 transfers the substrate M. The index robot 120 may transfer the substrate M between the index module 10 and the buffer unit 200 to be described later. The index robot 120 includes an index hand 122. The substrate M may be placed on the index hand 122. The index hand 122 may be provided to be forwardly and backwardly movable, rotatable in the third direction Z, and movable along the third direction Z. A plurality of hands 122 may be provided. The plurality of hands 122 may each be spaced apart from each other in an up/down direction. The plurality of hands 122 may be forwardly and backwardly movable independently of each other.

The index rail 124 is provided in the index frame 14. The index rail 124 is provided with its lengthwise direction along the second direction Y. The index robot 120 may be placed on the index rail 124, and the index robot 120 may be linearly movable along the index rail 124.

The controller 30 may control a substrate treating apparatus 1. The controller may comprise a process controller consisting of a microprocessor (computer) that executes a control of the substrate treating apparatus 1, a user interface such as a keyboard via which an operator inputs commands to manage the substrate treating apparatus 1, and a display showing the operation situation of the substrate treating apparatus 1, and a memory unit storing a treating recipe, i.e., a control program to execute treating processes of the substrate treating apparatus 1 by controlling the process controller or a program to execute components of the substrate treating apparatus 1 according to data and treating conditions. In addition, the user interface and the memory unit may be connected to the process controller. The treating recipe may be stored in a storage medium of the storage unit, and the storage medium may be a hard disk, a portable disk, such as a CD-ROM or a DVD, or a semiconductor memory, such as a flash memory.

The controller 30 may control the substrate treating apparatus 1 so a substrate treating method to be described below is performed. For example, the controller 30 may control components provided at the liquid treating chamber 400 to perform the substrate treating method described below.

The treating module 20 may include a buffer unit 200, a transfer frame 300, and a liquid treating chamber 400. The buffer unit 200 provides a space in which a substrate M taken into the treating module 20 and a substrate M taken out of the treating module 20 temporarily remain. The transfer frame 300 provides a space for transferring the substrate M between the buffer unit 200, the liquid treating chamber 400, and the drying chamber 500. The liquid treating chamber 400 supplies a liquid onto the substrate M to perform a liquid treatment process for treating the substrate M. The dry chamber 500 may perform a drying process for drying the substrate on which a liquid treatment has been completed.

The buffer unit 200 may be disposed between the index frame 14 and the transfer frame 300. The buffer unit 200 may be positioned at an end of the transfer frame 300. A slot (not shown) in which the substrate M is placed is provided inside the buffer unit 200. A plurality of slots (not shown) may be provided. The plurality of slots (not shown) may be spaced apart along the third direction Z.

A front face and a rear face of the buffer unit 200 are opened. The front face is a surface facing the index module 10, and the rear face is a surface facing the transfer frame 300. The index robot 120 may approach the buffer unit 200 through the front face, and the transfer robot 320 to be described later may approach the buffer unit 200 through the rear face.

The transfer frame 300 may have a lengthwise direction provided in the first direction X. The liquid treating chamber 400 and the drying chamber 500 may be disposed on both sides of the transfer frame 300. The liquid treating chamber 400 and the drying chamber 500 may be disposed at a side of the transfer frame 300. The transfer frame 300 and the liquid treating chamber 400 may be disposed along the second direction Y. The transfer frame 300 and the drying chamber 500 may be disposed along the second direction Y.

According to an embodiment, liquid treating chambers 400 may be disposed on both sides of the transfer frame 300. The liquid treating chambers 400 may be provided in an arrangement of A×B (where A and B are natural numbers greater than 1 or 1 respectively) along the first direction X and the third direction Z respectively at aside of the transfer frame 300.

The transfer frame 300 includes a transfer robot 320 and a transfer rail 324. The transfer robot 320 transfers the substrate M. The transfer robot 320 transfers the substrate M between the buffer unit 200, the liquid treating chamber 400, and the drying chamber 500. The transfer robot 320 includes a transfer hand 322 on which the substrate M is placed. The substrate M may be placed on the transfer hand 322. The transfer hand 322 may be provided to be forwardly and backwardly movable, to be rotatable around the third direction Z, and movable along the third direction Z. A plurality of hands 322 are provided to be spaced apart from each other in the up/down direction, and the plurality of hands 322 may be forwardly and backwardly movable independently of each other.

The transfer rail 324 may be provided in the transfer frame 300 along a lengthwise direction of the transfer frame 300. In an embodiment, the lengthwise direction of the transfer rail 324 may be provided along the first direction X. The transfer robot 320 may be placed on the transfer rail 324 and the transfer robot 320 may be movable on the transfer rail 324.

Figure 3:
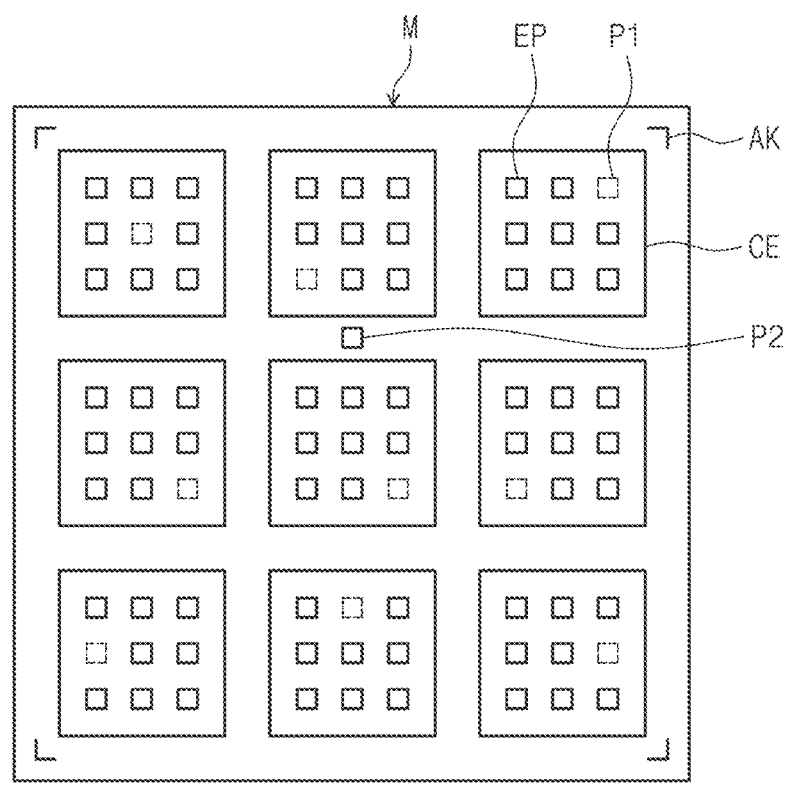
FIG. 3 is a top view of a substrate treated at a liquid treating chamber of FIG. 2.

FIG. 3 schematically illustrates the substrate which has been treated at the liquid treating chamber of FIG. 2 from above. Hereinafter, a substrate M treated in the liquid treating chamber 400 according to an embodiment of the inventive concept will be described in detail referring to FIG. 3.

Referring to FIG. 3, an object to be treated in the liquid treating chamber 400 may be any one of a wafer, a glass, and a photomask. For example, the substrate M treated in the liquid treating chamber 400 according to an embodiment of the inventive concept may be a photo mask, which is a 'frame' used in an exposing process.

The substrate M may have a rectangular form. The substrate M may be a photo mask that is a 'frame' used in the exposing process. At least one reference mark AK may be marked on the substrate M. For example, a plurality of reference marks AK may be formed in each corner region of the substrate M. The reference mark AK may be a mark called an align key used when aligning the substrate M.

Also, the reference mark AK may be a mark used to derive a position of the substrate M. For example, an imaging unit 4540 to be described later may acquire an image by imaging the reference mark AK and transmit the acquired image to the controller 30. The controller 30 then may analyze the image including the reference mark AK to detect an accurate position of the substrate M. In addition, the reference mark AK may be used to determine a position of the substrate M when the substrate M is transferred.

A cell CE may be formed on the substrate M. At least one cell CE, for example, a plurality of cells CE may be formed. A plurality of patterns may be formed at each cell CE. The patterns formed at each cell CE may be defined as one pattern group. Patterns formed at the cell CE may include an exposing pattern EP and a first pattern P1. A second pattern P2 may be proved in a region outside the cell region where the plurality of cells care formed.

The exposing pattern EP may be used to form an actual pattern on the substrate M. The first pattern P1 may be a single-cell representative pattern representing exposing patterns EP in one cell CE. In addition, when the plurality of cells CE are provided, the first pattern is provided in each cell, thereby a plurality of first patterns P1 may be provided. In an embodiment, each of the plurality of cells CE may be provided with single first pattern P1. However, the inventive concept is not limited thereto, and the plurality of first patterns P1 may be formed in one cell CE. The first pattern P1 may have a form in which portions of each exposing pattern EP are combined. The first pattern P1 may be referred to as a monitoring pattern. An average value of critical dimension of the plurality of first patterns P1 may be referred to as a critical dimension monitoring macro (CDMM).

When an operator inspects the first pattern P1 formed on any one cell CE through a scanning electron microscope (SEM), it is possible to estimate whether a form of the exposing patterns EPs formed on any one cell CE are good or bad. Accordingly, the first pattern P1 may serve as an inspection pattern to inspect the exposing patterns EPs. Unlike the above-described example, the first pattern P1 may be any one of the exposing patterns EPs used in an actual exposing process. Selectively, the first pattern P1 may be an inspection pattern and an exposing pattern used in the actual exposing at the same time.

The second pattern P2 may be an entire-cell representative pattern representing exposing patterns EP on whole cells of the substrate M. For example, the second pattern P2 may have a form in which portions of each of the first patterns P1 are combined.

When the operator inspects the second pattern P2 through the scanning electron microscope (SEM), it is possible to estimate whether a form of the exposing patterns EPs formed on one substrate M are good or bad. Accordingly, the second pattern P2 may function as an inspection pattern. In addition, the second pattern P2 may be an inspection pattern that is not used in an actual exposing process. The second pattern P2 may be a pattern for setting a process condition of an exposing apparatus. The second pattern P2 may be referred to as an anchor pattern.

Hereinafter, the substrate treating apparatus provided to the liquid treating chamber 400 will be described in detail. Hereinafter, a treating process performed while the liquid treating chamber 400 performs a fine critical dimension correction (FCC) process during a process of manufacturing a mask for an exposing process will be described as an example.

A substrate M to be taken in and treated at the liquid treating chamber 400 may be a substrate M on which a pre-treatment has been performed. A critical dimension of the first pattern P1 and a critical dimension of the second pattern P2 of the substrate M to be taken into the liquid treating chamber 400 may be different from each other. According to an embodiment, a width of the first pattern P1 may be relatively larger than a width of the second pattern P2. For example, the critical dimension of the first pattern P1 may be greater than the critical dimension of the second pattern P2. In on embodiment, the critical dimension of the first pattern P1 may have a first width (e.g., 69 nm). The critical dimension of the second pattern P2 may have a second width (e.g., 68.5 nm).

Figure 4:
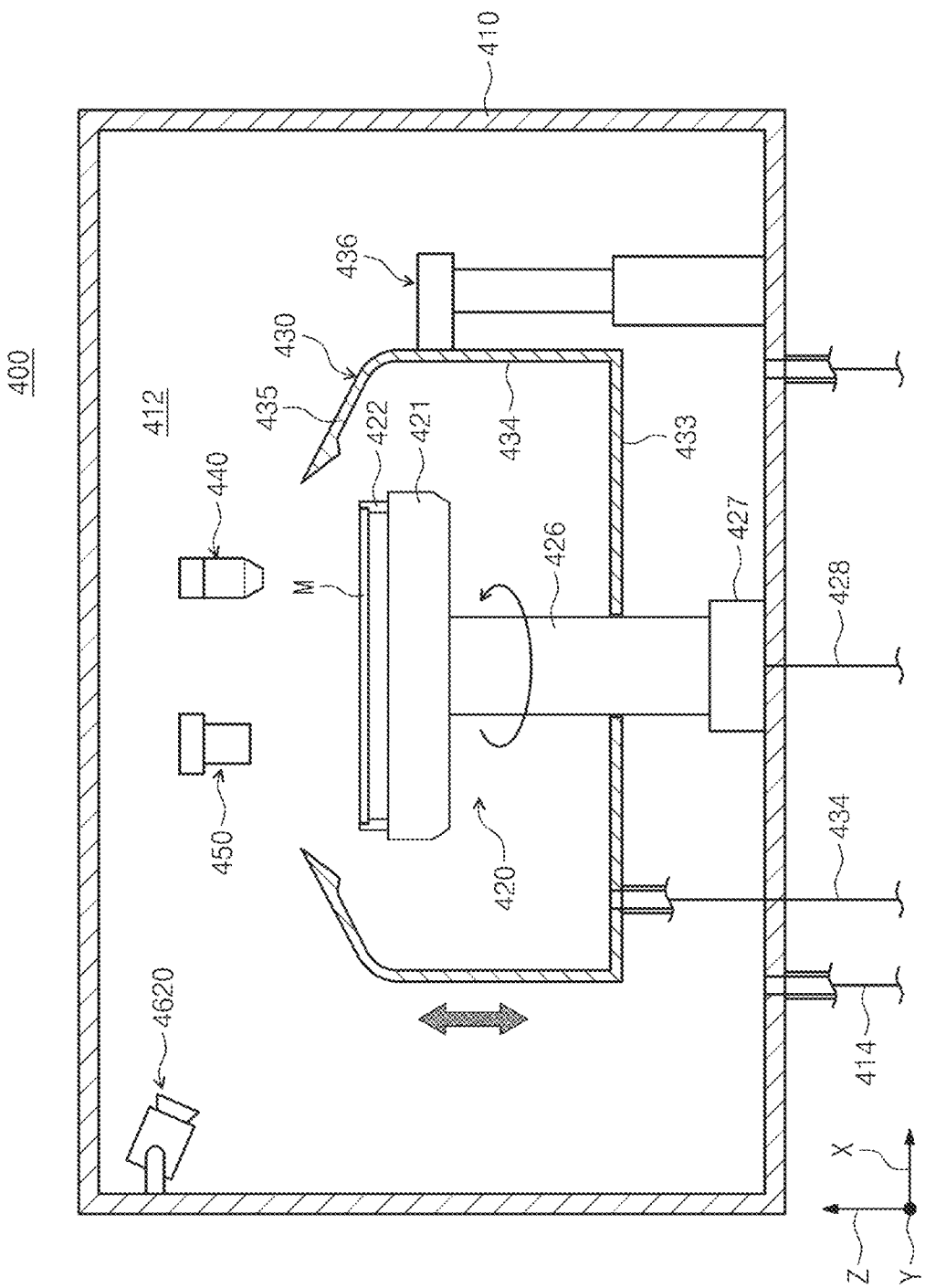
FIG. 4 schematically illustrates an embodiment of the liquid treating chamber of FIG. 2.
Figure 5:
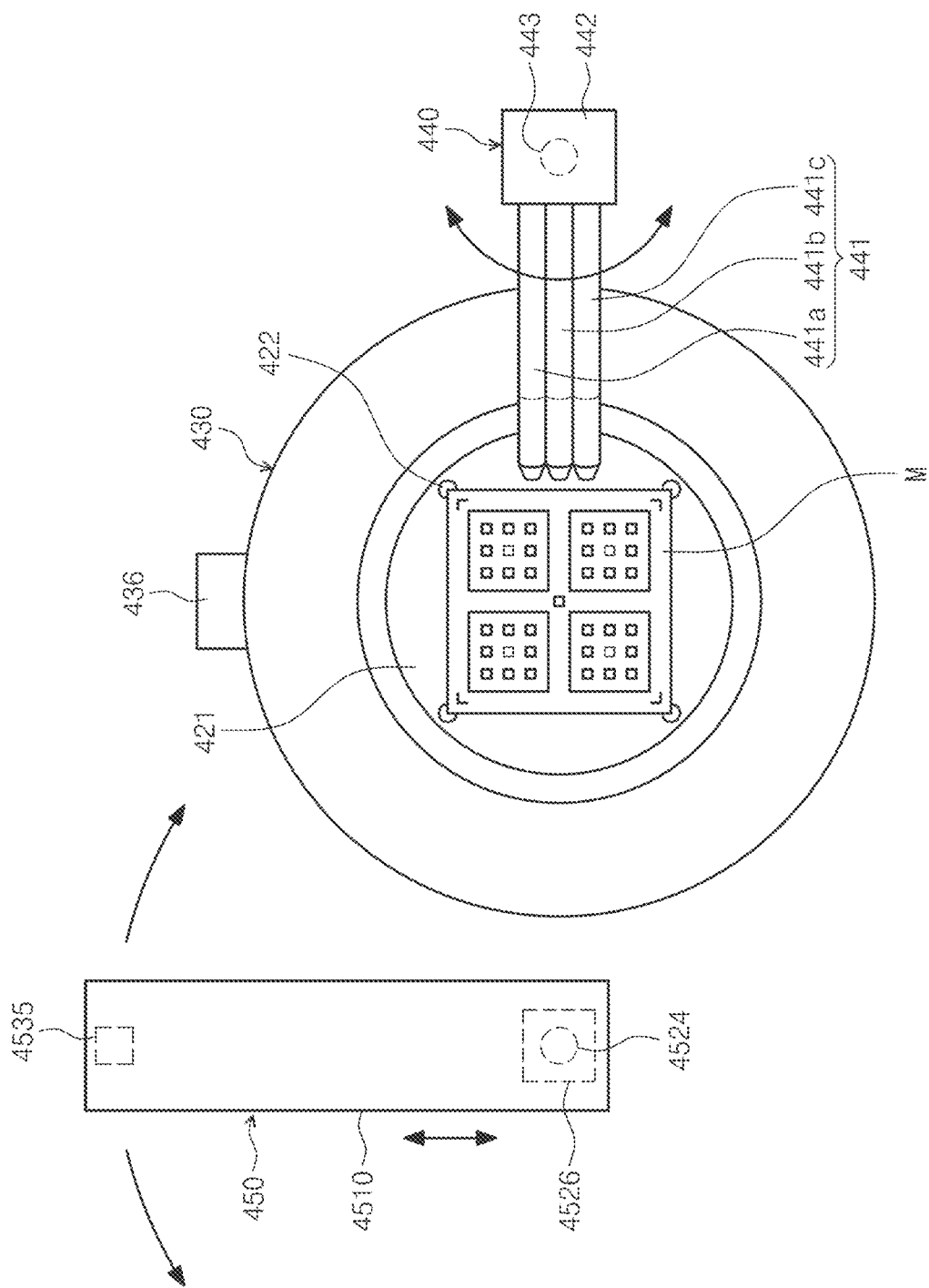
FIG. 5 is a top view of the liquid treating chamber of FIG. 4.

FIG. 4 schematically illustrates an embodiment of the liquid treating chamber of FIG. 2. FIG. 5 is a top view of the liquid treating chamber of FIG. 4. Referring to FIG. 4 and FIG. 5, the liquid treating chamber 400 may include a housing 410, a support unit 420, a treating container 430, a post-treating unit 450, a monitoring unit 460, and a home port 490.

The housing 410 has an inner space. The inner space may be provided with a support unit 420, a treating container 430, a liquid supply unit 440, a post-treating unit 450, a monitoring unit 460, and a home port 490. The housing 410 may be provided with a gateway (not shown) through which the substrate M may be taken in and taken out. An inner wall surface of the housing 410 may be coated with a material having a high corrosion resistance to a chemical supplied by the liquid supply unit 440.

An exhaust hole 414 may be formed on a bottom surface of the housing 410. The exhaust hole 414 may be connected to an exhaust member such as a pump capable of exhausting an inner space. Accordingly, a fume or the like that may be generated at the inner space may be exhausted to an outside of the housing 410 through the exhaust hole 414.

The support unit 420 may support the substrate M. The support unit 420 may support the substrate W at a treating space of the treating container 430 to be described later. The support unit 420 may rotate the substrate M. The support unit 420 may include a body 421, a support pin 422, a support shaft 426, and a driving member 427.

The body 421 may have a plate form. The body 421 may have a constant thickness. The body 421 may have a top surface provided in a generally circular form when viewed from above. The top surface of the body 421 may be provided to have an area relatively larger than that of the substrate M. The support pin 422 may be combined to the body 421.

The support pin 422 may support the substrate M. The support pin 422 may have a substantially circular form when viewed from above. When viewed from above, the support pin 422 may have a downwardly stepped portion which corresponds to an edge region of the substrate M. The support pin 422 may have a first surface and a second surface. For example, the first surface may support a bottom side of an edge region of the substrate M. The second surface may face a side of an edge region of the substrate M. Accordingly, if the substrate M is rotated, a movement of the substrate M in a lateral direction may be limited by the second surface.

At least one support pin 422 may be provided. For example, a plurality of support pins 422 may be provided. The support pin 422 may be provided in a number corresponding to the number of corners of the substrate M having a rectangular form. The support pin 422 may support the substrate M so the back-side (bottom surface) of the substrate M is spaced apart from a top surface of the body 421.

The support shaft 426 may be coupled to the body 421. The support shaft 426 may be positioned below the body 421. The support shaft 426 may be a hollow shaft. A fluid supply line 428 may be formed within the hollow shaft. The fluid supply line 428 may supply a treating fluid and/or a treating gas to below the substrate M. For example, the treating fluid may include a chemical or a rinsing liquid. The chemical may be a liquid having a acid properties or base properties. The rinsing liquid may be a pure water. For example, the treating gas may be an inert gas. The treating gas may dry a bottom of the substrate M. However, unlike the embodiment, the fluid supply line 428 may not be supplied to within the support shaft 426.

The support shaft 426 may be moved by the driving member 427 in the up/down direction. The support shaft 426 may be rotated by the driving member 427. The driving member 427 may be a hollow motor. When the driving member 427 rotates the support shaft 426, the body 421 coupled to the support shaft 426 may rotate. The substrate M placed on the support pin 422 installed on the body 421 may be rotated together with a rotation of the body 421.

The treating container 430 has a treating space. The treating container 430 has a treating space for treating the substrate M. The treating container 430 may have a treating space with an open top. The treating container 430 may have a cylindrical form with an open top. The substrate M may be liquid-treated and heat-treated in the treating space. The treating container 430 can prevent the treating liquid supplied to the substrate M from being scattered to the housing 410, the liquid supply unit 440, and the post-treating unit 450.

The treating container 430 may include a bottom unit, a vertical unit 434, and an inclined unit 435. The bottom unit 433 may have an opening at which the support shaft 426 is inserted when seen from above. The bottom unit 433 may have a discharge hole 434 formed for discharging a treating liquid supplied by the liquid supply unit 440. The vertical unit 434 may be extended from the bottom unit 433 in an upward direction along the third direction Z. The vertical unit 435 may be extend inclined from the vertical unit 434. For example, the inclined unit 435 may extend upwardly inclined with respect to the ground as the inclined unit 435 faces a direction of the substrate M supported on the support unit 420.

The treating container 430 may be coupled to a lifting/lowering member 436. The lifting/lowering member 436 may change a position of the treating container 430 along the third direction Z. The lifting/lowering member 436 may be a driving device for moving the treating container 430 in the up/down direction. The lifting/lowering member 436 may move the treating container 430 in an upward direction while a liquid treatment and/or a post treatment are performed on the substrate M. The lifting/lowering member 436 may move the treating container 430 in a downward direction while a monitoring unit 460 to be described later inspects a liquid film state of the substrate M. Also, the lifting/lowering unit 436 may move the treating container 430 in a downward direction if the substrate M is taken into the inner space 412 and if the substrate M is taken out from the inner space 412.

The liquid supply unit 440 may supply a liquid to the substrate M. The liquid supply unit 440 may supply a treating liquid for liquid treating the substrate M. The liquid supply unit 440 may supply the treating liquid to a substrate M supported by the support unit 420. In an embodiment, the liquid supply unit 440 may supply the treating liquid to a substrate M having a first pattern formed within a plurality of cells CE and a second pattern P2 formed outside a region at which the cells CE are formed.

The treating liquid may be an etching liquid or a rinsing liquid. The etching liquid may be a chemical. The etching liquid may etch a pattern formed on the substrate M. The etching liquid may also be referred to as an etching liquid. The etching liquid may be a liquid containing a mixed solution in which an ammonia, a water, and additives are mixed and a hydrogen peroxide is included. The rinsing liquid may clean the substrate M. The rinsing liquid may be provided as a known chemical liquid.

Referring to FIG. 5, the liquid supply unit 440 may include a nozzle 441, a fixing body 442, a rotation shaft 443, and a rotation member 444. The nozzle 441 may supply the treating liquid to the substrate M supported by the support unit 420. An end of the nozzle 441 may be connected to the fixing body 442, and another end thereof may extend in a direction from the fixing body 442 toward the substrate M. The nozzle 411 may extend from the fixing body 442 in the first direction X. The other end of the nozzle 411 may extend while being bent at a certain angle in a direction of the substrate M supported on the support unit 420.

The nozzle 411 may include a first nozzle 411a, a second nozzle 411b, and a third nozzle 411c. Any one of the first nozzle 411a, the second nozzle 411b, or the third nozzle 411c may supply a chemical among the above-described treating liquids. In addition, another one of the first nozzle 411a, the second nozzle 411b, and the third nozzle 411c may supply the rinsing liquid among the aforementioned treating liquids. The last one of the first nozzle 411a, the second nozzle 411b, or the third nozzle 411c may supply a different kind of chemical which is different from a chemical supplied by the another one of the first nozzle 411a, the second nozzle 411b, or the third nozzle 411c.

A body 442 may fix and support the nozzle 441. The body 442 may be connected to the rotation shaft 443 rotated in the third direction Z by the rotation member 444. When the rotation member 444 rotates the rotation shaft 443, the body 442 may rotate around the third direction Z. Accordingly, an outlet of the nozzle 441 may move between a liquid supply position which is a position where the treating liquid is supplied to the substrate M and a standby position which is a position where the treating liquid is not supplied to the substrate M.

Figure 6:
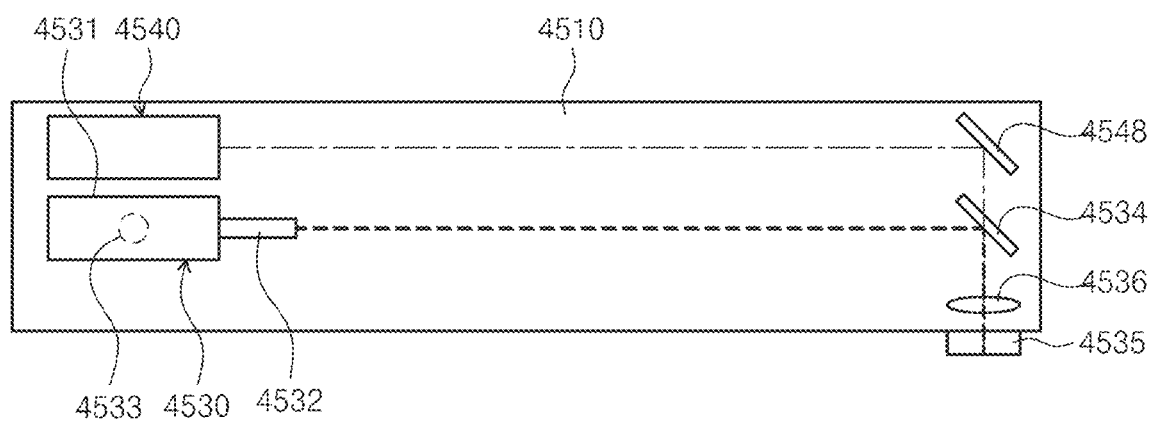
FIG. 6 schematically illustrates a post-treating unit of FIG. 4 as viewed from the front.
Figure 7:
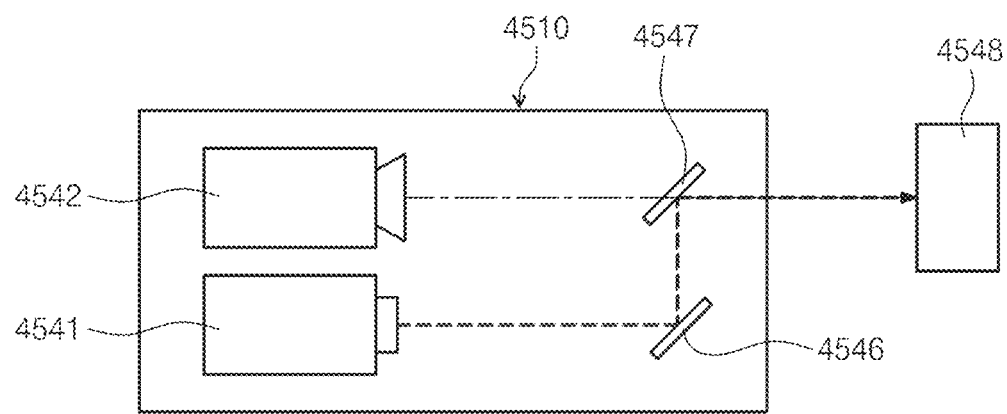
FIG. 7 schematically illustrates the post-treating unit of FIG. 6 as viewed from above.

FIG. 6 schematically illustrates a state in which the post-treating unit of FIG. 4 is viewed from the front. FIG. 7 schematically illustrates the post-treating unit of FIG. 6 as viewed from above.

Referring to FIG. 6 and FIG. 7, the post-treating unit 450 may perform a post-treatment on the substrate M. The post-treating unit 450 may post-treat the substrate M to which the treating liquid is supplied. For example, the post-treating unit 450 may perform the post-treatment on the substrate M on which the liquid film is formed after the liquid is supplied on the substrate M by the liquid supply unit 440. The post-treatment performed by the post-treating unit 450 may be a heat treatment. For example, the post-treatment performed by the post-treating unit 450 may be heat treatment with respect to a specific area of the substrate M by irradiating a laser light on the substrate M on which the liquid film is formed. That is, the post-treating unit 450 according to an embodiment of the inventive concept may be a heating unit for heating the substrate M. In addition, the heating unit according to an embodiment of the inventive concept may be an irradiation module for irradiating the laser light. Hereinafter, for a convenience of description, a case in which the post-treating unit 450 according to an embodiment of the inventive concept is an irradiation module will be described as an example.

The irradiation module 450 may perform a heat treatment on the substrate M. The irradiation module 450 may irradiate a light with respect to the substrate M. For example, the irradiation module 450 may image an image or/and a video for heating the substrate M. The irradiation module 450 may include a housing 4510, a moving unit 4520, a laser unit 4530, and an imaging unit 4540.

The housing 4510 has an installation space therein. The laser unit 4530 and the imaging unit 4540 may be positioned in the installation space of the housing 4510. In an embodiment, a laser unit 4530, a camera unit 4542, and a lighting unit 4544 may be positioned in the installation space of the housing 4510. The housing 4510 protects the laser unit 4530 and the imaging unit 4540 from particles, a fume, or scattering droplets generated during the process.

An opening may be formed under the housing 4510. An irradiation end 4535 to be described later may be inserted into the opening of the housing 4510. As the irradiation end 4535 is inserted into the opening of the housing 4510, an end of the irradiation end 4535 can be positioned to protrude from a bottom end of the housing 4510. For example, a portion of a barrel 4537 to be described later may protrude from the bottom end of the housing 4510.

The moving unit 4520 moves the housing 4510. The moving unit 4520 may move the irradiation end 4535 to be described later by moving the housing 4510. The moving unit 4520 may include a driver 4522, a shaft 4524, and a moving member 4526.

The driver 4522 may be a motor. The driver 4522 may be connected to the shaft 4524. The driver 4522 may move the shaft 4524 in the vertical direction. The driver 4522 may rotate the shaft 4524. In an embodiment, a plurality of drivers 4522 may be provided. Any one of the plurality of drivers 4522 may be provided as a rotating motor for rotating the shaft 4524, and the other of the plurality of drivers 4522 may be provided as a linear motor for moving the shaft 4524 in the vertical direction.

The shaft 4524 may be connected to the housing 4510. The shaft 4524 may be connected to the housing 4510 via the moving member 4526. As the shaft 4524 rotates, the housing 4510 may also rotate. Accordingly, a position of the irradiation end 4535 to be described later may also be changed. For example, the position of the irradiation end 4535 may be changed in the third direction Z. In addition, the position of the irradiation end 4535 may be changed with respect to the third direction Z as a rotation axis.

When viewed from above, a center of the irradiation end 4535 may move to the center of the shaft 4524 by drawing an arc. When viewed from above, the center of the irradiation end 4535 may be moved to pass through a center of the substrate M supported by the support unit 420. The irradiation end part 4535 may be moved between a process position of irradiating the laser light L to the substrate M by the moving unit 4520 and a standby position, which is a position of standing by without performing a heat treatment on the substrate M. A home port 490 to be described later is positioned at the standby position.

The moving member 4526 may be provided between the housing 4510 and the shaft 4524. The moving member 4526 may be an LM guide. The moving member 4526 may move the housing 4510 in a lateral direction. The moving member 4526 may move the housing 4510 in the first direction X and/or the second direction Y. The position of the irradiation end 4535 may be variously changed by the driver 4522 and the moving member 4526.

The laser unit 4530 may heat the substrate M. The laser unit 4530 may heat the substrate M supported on the support unit. The laser unit 4530 may heat a partial region of the substrate M. The laser unit 4530 may heat a specific region of the substrate M. The laser unit 4530 may heat the substrate M on which a liquid film is formed by supplying the chemical C. The laser unit 4530 may heat a pattern formed on the substrate M. The laser unit 4530 may heat any one of the first pattern P1 or the second pattern P2. In an embodiment, the heating unit 4530 may heat the second pattern P2 by irradiating a laser light L with the second pattern P2.

The laser unit 4530 may include a laser irradiation unit 4531, a beam expander 4532, a tilting member 4533, a bottom reflective member 4534, and a lens member 4535. The laser irradiation unit 461 may irradiate the laser light L. The laser irradiation unit 4531 may emit the laser light L having a straightness. The laser light L irradiated by the laser irradiation unit 461 may be irradiated to the substrate M after passing through the bottom reflective member 4534 and the lens member 4535. In an embodiment, the laser light L irradiated by the laser irradiation unit 461 may be irradiated to the second pattern P2 formed on the substrate M after passing through the bottom reflective member 4534 and the lens member 4535.

The beam expander 4532 may control a characteristic of the laser light L irradiated from the laser irradiation unit 4531. The beam expander 4532 may adjust a form of the laser light L irradiated from the laser irradiation unit 4531. Also, the beam expander 4532 may adjust a profile of the laser irradiated from the laser irradiation unit 4531. For example, the laser light L irradiated from the laser irradiation unit 4531 may change a diameter of the beam expander 4532. The laser light L irradiated from the laser irradiation unit 4531 may have its diameter expanded or reduced at the beam expander 4532.

The tilting member 463 may tilt an irradiation direction of the laser light L irradiated by the laser irradiation unit 461. The tilting member 463 may rotate the laser irradiation unit 461 based on an axis. The tilting member 4533 may tilt the irradiation direction of the laser light L irradiated by the laser irradiation unit 461 by rotating the laser irradiation unit 4531. The tilting member 463 may include a motor.

The bottom reflective member 4534 may change an irradiation direction of the laser light L irradiated from the laser irradiation unit 4531. For example, the bottom reflective member 4534 may change an irradiation direction of the laser light L irradiated to the horizontal direction to a vertical bottom direction. For example, the bottom reflective member 4534 may change an irradiation direction of the laser light L to a direction of the irradiation end 4524. The laser light L which has been refracted by the bottom reflective member may go to the substrate M to be treated or a measuring member 491 provided at a home port 490 to be described later.

The bottom reflective member 4534 may be positioned to overlap the top reflective member 4548 to be described later when viewed from above. The bottom reflective member 4534 may be disposed below the top reflective member 4548. The bottom reflective member 4534 may be tilted at the same angle as the top reflective member 4548.

The lens member 4535 may include a lens 4536 and a barrel 4537. In an embodiment, the lens 4536 may be an objective lens. The barrel 4537 may be installed at the bottom end of the lens. The barrel 4537 may have a substantially cylindrical shape. The barrel 4537 may be inserted into an opening formed at the bottom end of the housing 4510. An end of the barrel 4537 may be positioned to protrude from the bottom end of the housing 4510.

The lens member 4535 may function as an irradiation end 4535 through which the laser light L is irradiated to the substrate M. The laser light L irradiated by the laser unit 4530 may be irradiated to the substrate M through the irradiation end 4535. The imaging of the camera unit 4542 may be provided through the irradiation end 4535. The light irradiated by the lighting module 4544 may be provided through the irradiation end 4535.

The imaging unit 4540 may image the laser light L irradiated by the laser unit 4530. The imaging unit 4540 may acquire an image, such as an video and/or an image, of a region at which the laser light L is irradiated from the laser module 4330. The imaging unit 4540 may monitor the laser light L irradiated from the laser irradiation unit 4531. The imaging unit 4540 may acquire an image or/and a video of the laser light L irradiated from the laser irradiation unit 4531. In an embodiment, the imaging unit 4540 may acquire the image, such as a video and/or an image of the laser light L irradiated to the substrate M, and transmit a related data to the controller 30. In addition, the imaging unit 4540 may acquire images such as an image and/or a video of the laser light L irradiated to the measuring member 491 to be described later, and transmit a related data to the controller 30.

The imaging unit 4540 may monitor an information of the laser light L. For example, the imaging unit 4540 may monitor a diameter information of the laser light L. In addition, the imaging unit 4540 may monitor a center information of the laser light L. In addition, the imaging unit 4540 may monitor a profile information of the laser light L. The imaging unit 4540 may include a camera unit 4542, a lighting unit 4544, and a top reflective member 4548.

The camera unit 4542 acquires the image of the laser light L irradiated from the laser irradiation unit 4531. For example, the camera unit 4542 may obtain an image including a point at which the laser light L irradiated by the laser irradiation unit 4531 is irradiated. In addition, the camera unit 4542 acquires the image of the substrate M supported by the support unit 420.

The camera unit 4542 may be a camera. A direction in which the camera unit 4542 images to acquire the image may be directed toward a top reflective member 4548 to be described later. The camera unit 4542 may transmit an acquired photo and/or video to the controller 30.

The lighting unit 4544 may provide a light so that the camera unit 4542 may easily acquire the image. The lighting unit 4544 may include a lighting member 4545, a first reflective plate 4546, and a second reflective plate 4547. The lighting member 4545 irradiates the light. The lighting member 4545 provides the light. The light provided by the lighting member 4545 may be sequentially reflected along the first reflective plate 4546 and the second reflective plate 4547. The light provided by the lighting member 4545 may be reflected from the second reflective plate 4547 and irradiated in a direction toward the top reflective member 4548 to be described later.

The top reflective member 4548 may change the imaging direction of the camera unit 4542. For example, the top reflective member 4548 may change the imaging direction of the camera unit 4542 which is a horizontal direction to a vertical downward direction. For example, the top reflective member 4548 may change the imaging direction of the camera unit 4542 to face the irradiation end 4535. The top reflective member 4548 may change the irradiation direction of the light of the lighting member 4545, which is sequentially transmitted through the first reflective plate 4546 and the second reflective plate 4547, from the horizontal direction to the vertical downward direction. For example, the top reflective member 4548 may change the irradiation direction of the light of the lighting unit 4544 to face the irradiation end 4535.

The top reflective member 4548 and the bottom reflective member 4534 may be positioned to overlap when viewed from above. The top reflective member 4548 may be disposed above the bottom reflective member 4534. The top reflective member 4548 and the bottom reflective member 4534 may be tilted at the same angle. The top reflective member 4548 and the bottom reflective member 4534 may have a coaxial axis if an irradiation direction of the laser light L irradiated by the laser irradiation unit 4531, an imaging direction in which the camera unit 4542 acquires the image, and an irradiation direction of the light provided by the lighting unit 4544 are seen from above.

Referring back to FIG. 4, the monitoring unit 460 may monitor the substrate M supported by the support unit 420. The monitoring unit 460 may monitor a state of the liquid film CC formed on the substrate M supported by the support unit 420. The state of the liquid film CC of the substrate M sensed by the monitoring unit 460 may be transmitted to the controller 30. The monitoring unit 460 according to an embodiment of the inventive concept may include a vision member 4620. For example, the vision member 4620 may be a camera.

The vision member 4620 is disposed in the inner space 412 of the housing 410. In an embodiment, the vision member 4620 may be installed on a sidewall of the housing 410. The vision member 4620 may be installed on the sidewall of the housing 410 at a position higher than the support unit 420. The vision member 4620 may be disposed at a position capable of minimizing an interference with the liquid supply unit 440 and the post-treating unit 450. The vision member 4620 may be installed on the sidewall of the housing 410 to image the substrate M to be imaged in a downwardly inclined direction. In addition, the vision member 4620 may be installed in a position capable of preserving an angle of view for monitoring the substrate M supported by the support unit 420 on the side wall of the housing 410.

The vision member 4620 may detect the state of the liquid film CC formed on the substrate M. The vision member 4620 may detect the state of the liquid film CC formed by the chemical C supplied from the liquid supply unit 440 to the substrate M. According to an embodiment of the inventive concept, the vision member 4620 may image a surface of the liquid film CC formed on the substrate M. The vision member 4620 may detect a flow of the chemical C forming the liquid film CC from an imaged surface of the liquid film CC. The vision member 4620 may detect a vibration of the liquid film CC from the flow of the chemical C in the liquid film CC formed on the substrate M. For example, if the flow of the chemical C in the liquid film CC relatively increases, the vision member 4620 may detect that the vibration has been applied to the substrate M to cause the vibration in the liquid film CC. Contrarily, the vision member 4620 may detect that the substrate M and the liquid film CC are in a stable state if the flow of the chemical C in the liquid film CC is relatively reduced. A detailed description of a mechanism by which the controller 30 controls the substrate treating apparatus 1 according to the state of the liquid film detected by the monitoring unit 460 will be described later.

Figure 8:
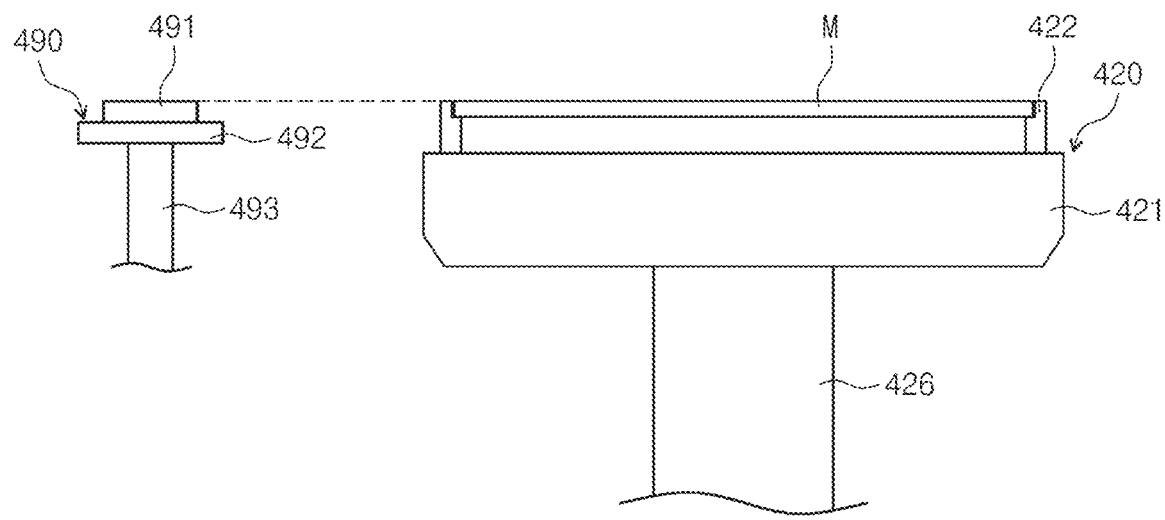
FIG. 8 schematically illustrates an embodiment of a home port of FIG. 4.
Figure 9:
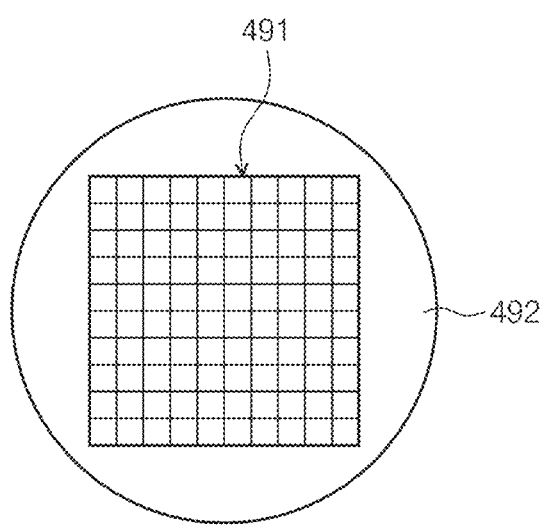
FIG. 9 schematically illustrates the home port and a detection member of FIG. 8 as viewed from above.

FIG. 8 schematically illustrates an embodiment of the detection member of FIG. 4. FIG. 9 schematically illustrates the inspection member of FIG. 8 as viewed from above. Referring to FIG. 8 and FIG. 9, the home port 490 is positioned in an inner space of the housing 410. The home port 490 may be installed in a region below the irradiation end 4535 if the irradiation end 4535 is in a standby position by the moving unit 4520. That is, the home port 490 provides a standby position at which the laser unit 4530 stands by. The home port 490 may include a measuring member 491, a plate 492, and a support frame 493.

The measuring member 491 is provided at the home port 490. The measuring member 491 may be positioned at a top end of the plate 492 to be described later. In an embodiment, if the irradiation end 4535 is in the standby position, the measuring member 491 may be positioned in a region below the irradiation end 4535.

The measuring member 491 detects the characteristics of the laser light L irradiated from the laser unit 4530. For example, the measuring member 491 may measure a clarity of the laser light L, a circular ratio of the laser light L, a gradient of the laser light L, and/or a center position data of the laser light L among characteristics of the laser light L irradiated from the laser unit 4530.

According to an embodiment, the imaging unit 4540 may transmit an image and/or a video of the laser light L irradiated with the measuring member 491 and the measuring member 491 to the controller 30. The controller 30 may change the characteristics of the laser light L based on the transmitted data of the laser light L.

The measuring member 491 may be defined as a global coordinate system. A preset reference position may be marked on the measuring member 491. In addition, the measuring member 491 may include a scale to check an error between the reference position and the irradiation position to which the laser light L is irradiated.

The measuring member 491 may be combined to a top surface of the plate 492. The plate 492 may be supported by a support frame 493. The support frame 493 may upwardly/downwardly move by a lifting/lowering member which is not shown. A height of the measuring member 491 determined by the plate 492 and the support frame 493 may be set as the same height as the substrate M supported by the support unit 420. A height from a bottom surface of the housing 410 to a top surface of the measuring member 491 may be the same as a height from the bottom surface of the housing 410 to a top surface of the substrate M supported by the support unit rlxk420. This is to match a height of the irradiation end 4535 when measuring a characteristic of the laser light L and a height of the irradiation end 4535 when heating the substrate M, using the measuring member 491. Also, if an irradiation direction of the laser light L irradiated by the laser irradiation unit 461 is slightly distorted with respect to a third direction Z, the irradiation position of the laser light L may vary according to a height of the irradiation end 4535, and thus the measuring member 491 may be provided at the same height as the substrate M supported by the support unit 420.

Hereinafter, a substrate treating method according to an embodiment of the inventive concept will be described in detail. The substrate treating method described below may be performed by the liquid treating chamber 400 described above. Also, the controller 30 can control components of the liquid treating chamber 400 so that the liquid treating chamber 400 can perform the substrate treating method described below. For example, the controller 30 may generate a control signal for controlling at least one of a support unit 420, a lifting/lowering member 436, a liquid supply unit 440, and a monitoring unit 460 so that the components of the liquid treating chamber 400 may perform the substrate treating method described below.

Figure 10:
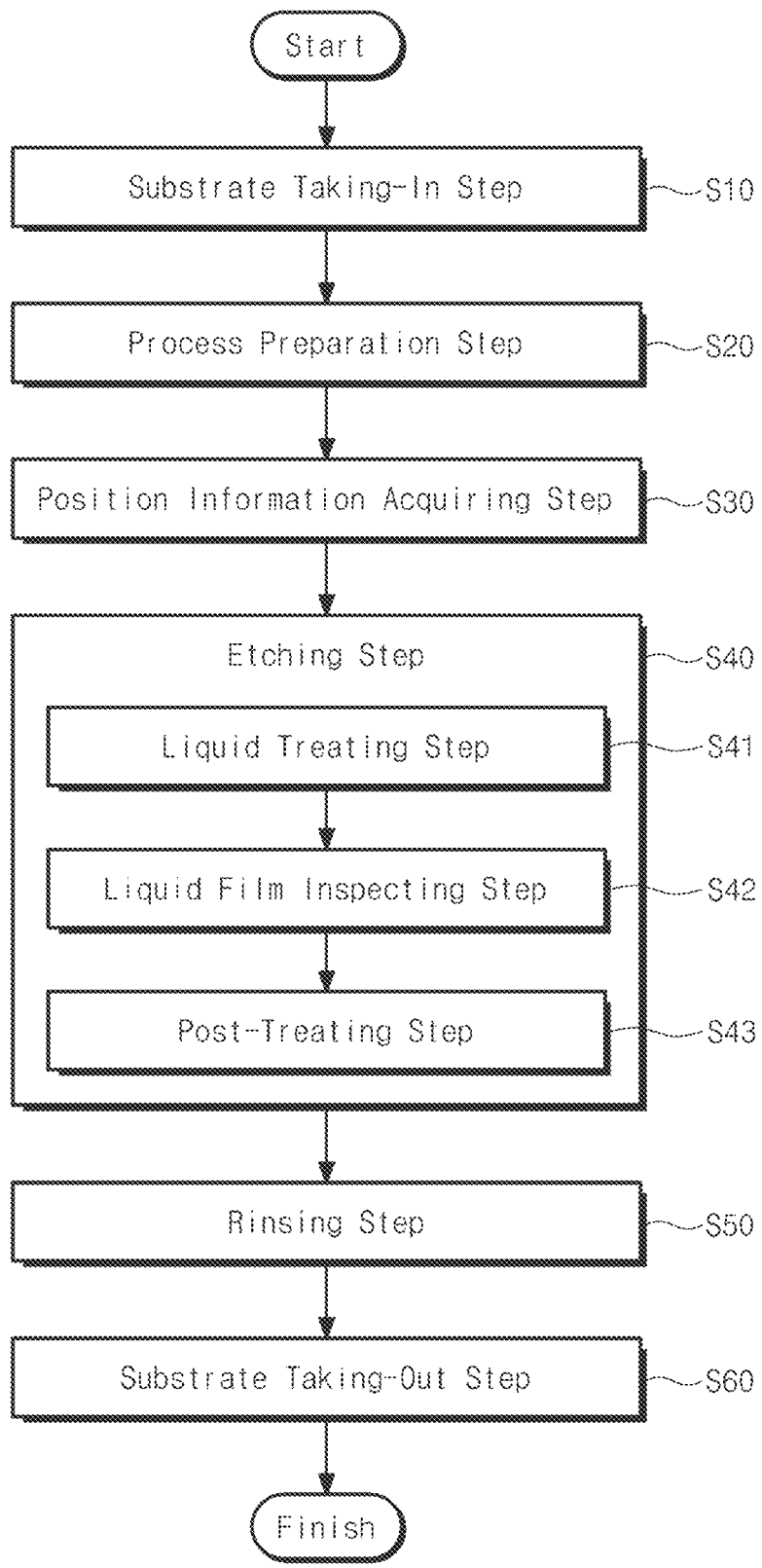
FIG. 10 is a flowchart illustrating a substrate treating method according to an embodiment of the inventive concept.
Figure 11:
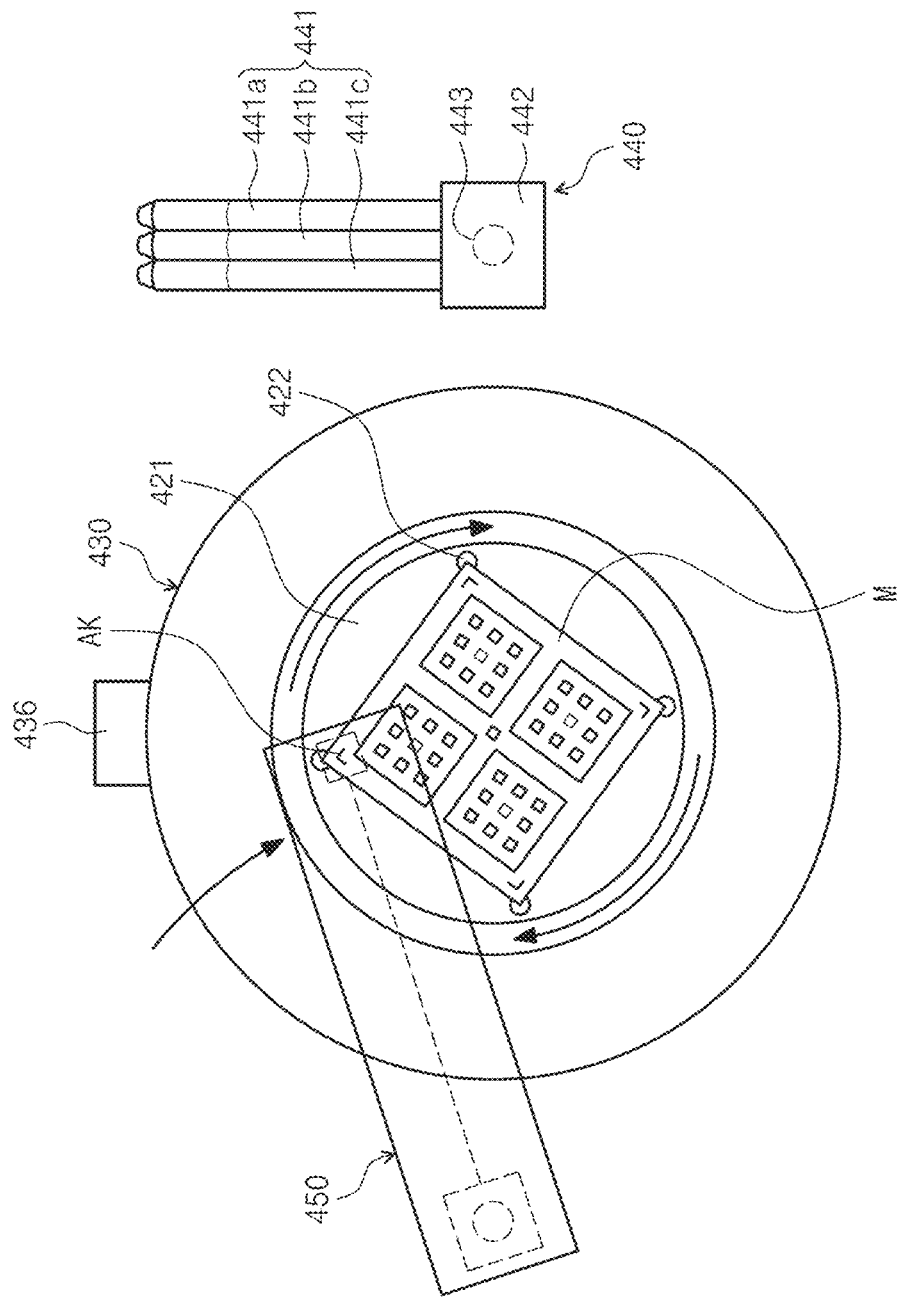
FIG. 11 illustrates the substrate treating apparatus at a position information acquiring step of FIG. 10.

FIG. 10 is a flowchart illustrating a substrate treating method according to an embodiment of the inventive concept. FIG. 11 illustrates the substrate treating apparatus performing a position information acquiring step of FIG. 10. Referring to FIG. 10 and FIG. 11, the substrate treating method according to an embodiment of the inventive concept may include a substrate taking-in step S10, a process preparing step S20, a position information acquiring step S30, an etching step S40, a rinsing step S50, and a substrate taking-out step S60.

In the substrate taking-in step S10, the substrate is taken into an inner space 412 of the housing 410. For example, a door (not shown) may open an in/out gateway (not shown) formed at the housing 410. In addition, in the substrate taking-in step S10, the transfer robot 320 may seat the substrate M on a support unit 420. While the transfer robot 320 seats the substrate M on the support unit 420, a lifting/lowering member 436 may lower a position of a treating container 430.

The process preparing step S20 may be performed after a taking-in of a substrate M is completed. In the process preparing step S20, it may be confirmed whether an error occurs at the irradiation position of a laser light L irradiated to the substrate M. For example, in the process preparing step S20, a laser unit 4530 may irradiate a test laser light L to a coordinate system of a measuring member 491 of the error checking unit 490. If the test laser light L irradiated from the laser unit 4530 is irradiated to the preset target position displayed in advance on the coordinate system of the measuring member 491, it is determined that a distortion has not occurred at the laser irradiation unit 461, and the following position information acquiring step S30 to be described later may be performed. Also, not only is if confirmed whether an error occurs at the irradiation position of the laser light L at the process preparation step S20, but a configuration of the liquid treating chamber 400 may return to an early state.

The position information acquisition step S30 may be performed by moving the irradiation end 4535 of the irradiation module 450 between the standby position and the process position of irradiating the substrate M with the laser light L, and by the support unit 420 rotating the substrate M in a direction. If the irradiation end 4535 is moved and the substrate M rotates in a direction, the irradiation end 4535 and a reference mark AK may coincide with each other at a specific point in time, as shown in FIG. 11. In this case, the imaging unit 4540 may obtain an image and/or video data for the reference mark AK. The controller 30 may obtain a coordinate value with respect to the reference mark AK through the image and/or video data acquired by the imaging unit 4540. In addition, the controller 30 may store in advance the left and right widths of the substrate M, a coordinate data on the center point of the substrate M, and a coordinate data on positions of a first pattern P1, a second pattern P2, and an exposure pattern EP within the substrate M. The controller 30 may obtain a position information on the center point of the substrate M, the first pattern P1, and the second pattern P2 based on the obtained coordinate value for the reference mark AK and the previously stored data.

In an etching step S40, an etching on a pattern formed on the substrate M may be performed. In the etching step S40, an etching with respect to the pattern formed on the substrate M can be carried out so that a critical dimension of the first pattern P1 and a critical dimension of the second pattern P2 coincide with each other. For example, the etching step S40 may be a critical dimension correction process for correcting a critical dimension difference between the first pattern P1 and the second pattern P2 described above. The etching step S40 may include a liquid treating step S41, a liquid film step S42, and a heating step S42.

Figure 12:
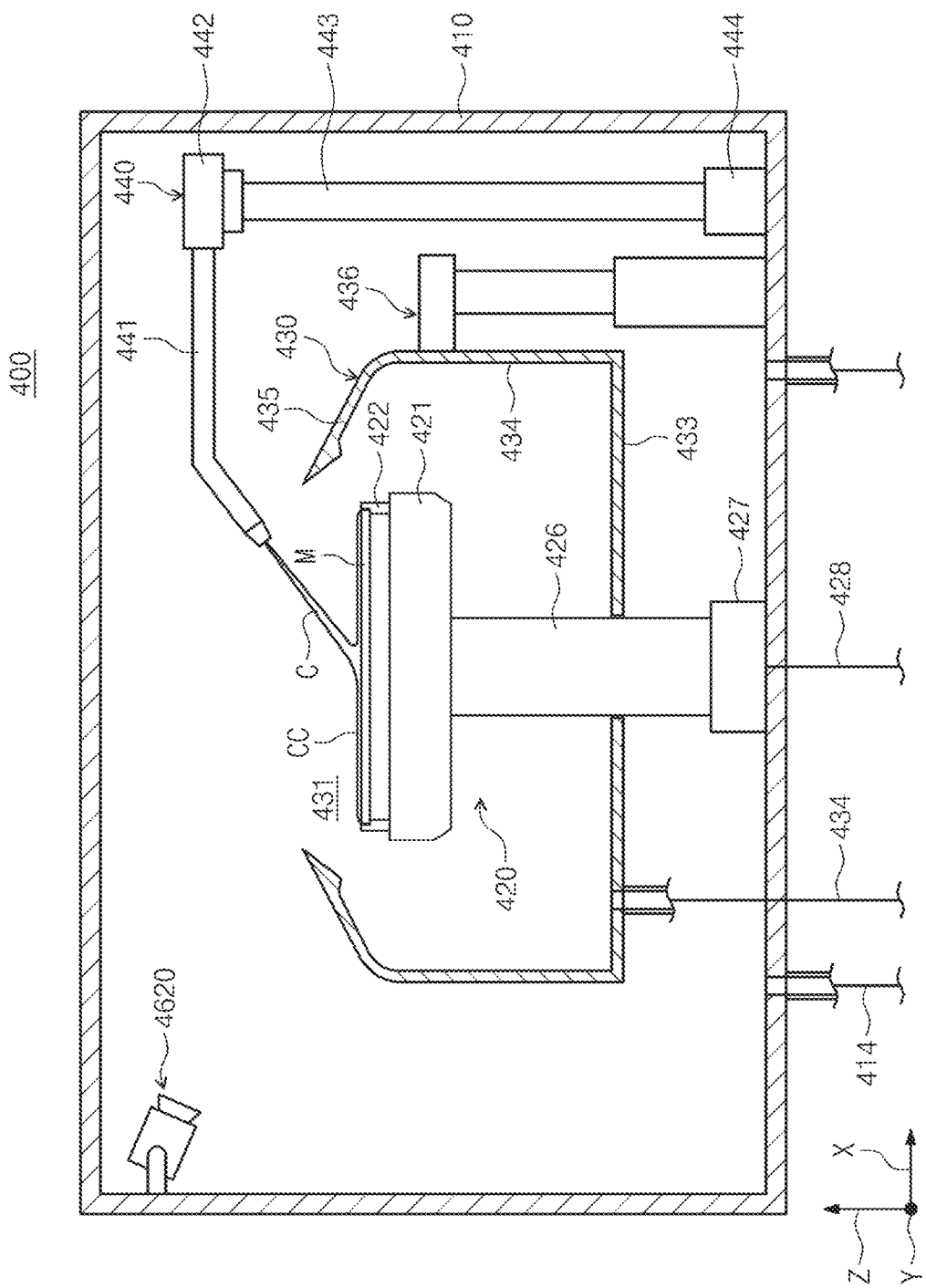
FIG. 12 illustrates the substrate treating apparatus at a liquid treating step of FIG. 10.

FIG. 12 illustrates a state of a substrate treating apparatus for performing a liquid treating step of FIG. 10. Referring to FIG. 12, the liquid treating step S41 may be a step in which a liquid supply unit 440 supplies an etchant which is a chemical C to a substrate M. In the liquid treating step S41, a support unit 420 may not rotate the substrate M. This is minimize a deviation of a position of the substrate M to accurately irradiate the laser light L to a specific pattern at a heating step S43 to be explained later.

An amount of the chemical C supplied at the liquid treating step S41 may be supplied enough to form a puddle of the chemical C supplied onto the substrate M. According to the liquid treating step S41 of an embodiment of the inventive concept, the chemical C may be supplied from a top surface of the substrate M supported on the support unit 420 to a set height. For example, the amount of the chemical C supplied at the liquid treating step S41 may cover an entire top surface of the substrate M, but may be supplied to a degree that the amount of the chemical C does not flow down or is not large even when if chemical C flows down from the substrate M. If necessary, the chemical C may be supplied to an entire top surface of the substrate M while a nozzle 441 changes its position.

In the above-described embodiment, the chemical C is supplied onto the substrate M without rotating the substrate M in the liquid treating step S41, but the inventive concept is not limited thereto. For example, in the liquid treating step S41, the chemical C may be supplied onto the substrate M while rotating the substrate M.

Figure 13:
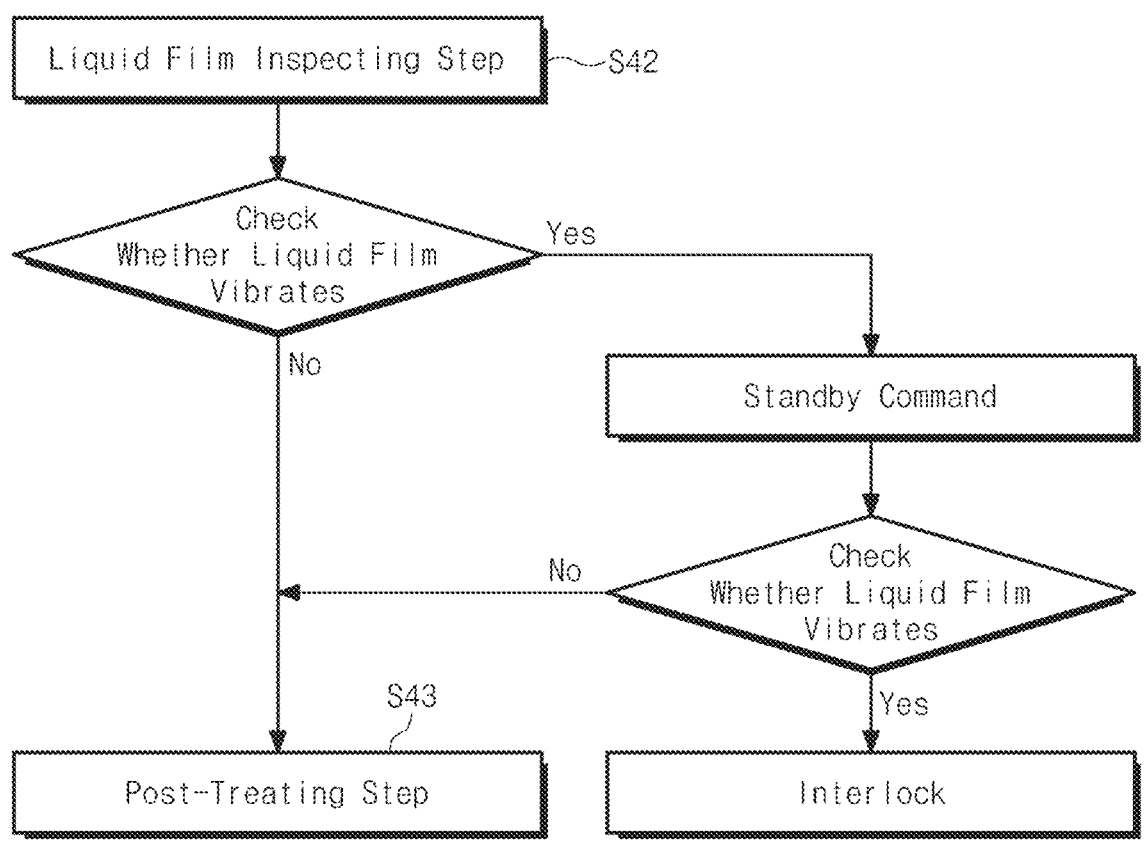
FIG. 13 is a flowchart illustrating an embodiment of a liquid film inspecting step of FIG. 10.
Figure 14:
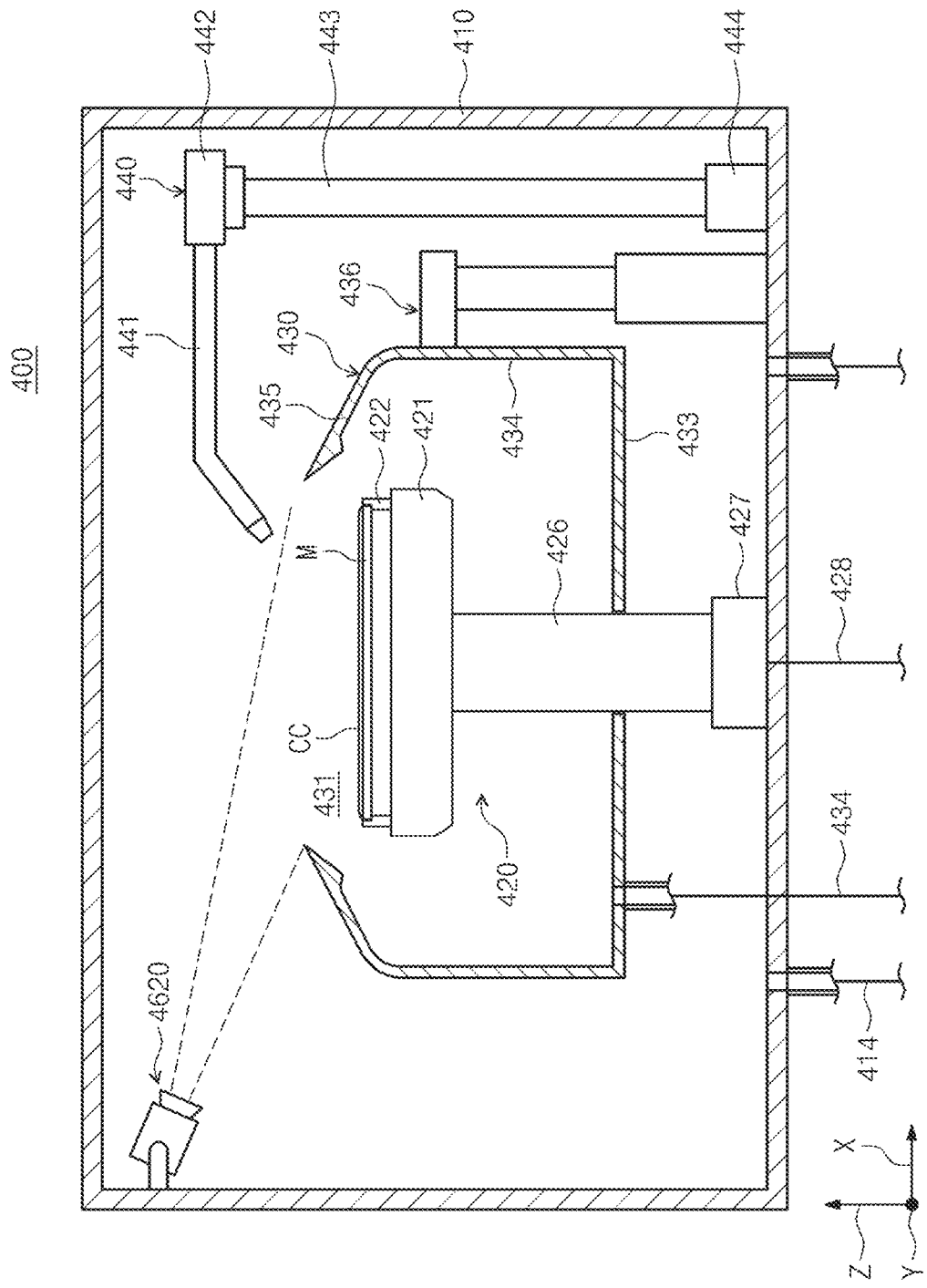
FIG. 14 illustrates the substrate treating apparatus at the liquid film inspecting step of FIG. 13.

FIG. 13 is a flowchart illustrating an embodiment of the liquid film inspecting step of FIG. 10. FIG. 14 illustrates the substrate treating apparatus performing the liquid film inspecting step of FIG. 13. Hereinafter, a liquid film inspecting step according to an embodiment of the inventive concept will be described in detail with reference to FIG. 13 and FIG. 14.

In the liquid film inspecting step S42, a state of the liquid film CC formed by the chemical C supplied to the substrate M is inspected in the liquid treating step S41. The liquid film inspecting step S42 may be performed after the liquid treating step S41 is completed. Selectively, the liquid film inspecting step S42 may be performed while the liquid treating step S41 is being performed. In addition, the liquid film inspecting step S42 may be performed while an etching step S40 is performed.

In the liquid film inspecting step S42, the state of the liquid film CC formed on the substrate M is inspected using the monitoring unit 460. According to an embodiment, in the liquid film inspecting step S42, the state of the liquid film CC formed on the substrate M may be detected based on the surface of the substrate M imaged by the vision member 4620.

In the liquid film inspecting step S42, the surface of the substrate M may be imaged to detect the chemical C flowing on the surface of the liquid film CC formed on the substrate M. In the liquid film inspecting step S42, it is possible to check whether the substrate M and/or the liquid film CC vibrate by detecting the amount of chemical C flowing on the surface of the liquid film CC. For example, if the flow of the chemical C is not detected in the liquid film CC, the vision member 4620 may determine that a vibration is not generated in the substrate M and the liquid film CC. In addition, if the vision member 4620 detects the flow of chemical C in the liquid film CC, but a resulting vibration value does not exceed a limit range, the controller 30 may generate a control signal which executes a progress command to perform a post-treating step S43 to be described later. Accordingly, a post-treating step S43 to be described later on the substrate M is performed.

Unlike the above description, if the flow of the chemical C is detected in the liquid film CC, the vision member 4620 may determine that the vibration is applied to the substrate M to generate the vibration in the liquid film CC. If the flow of the chemical C is detected in the liquid film CC, the vision member 4620 may detect a flow amount of the chemical C and convert it into a vibration value.

The controller 30 may record a limit range for the vibration generated in the substrate M and the liquid film CC. If the vibration value generated in the liquid film CC detected by the vision member 4620 exceeds a limit value, the controller 30 may generate a control signal which executes a standby command to stop a driving of the substrate treating apparatus 1. The controller 30 may generate a control signal for maintaining a standby command for a preset time. For example, the preset time may be up to 5 minutes. For example, the standby command may be in a state in which the support unit 420 does not rotate and the liquid supply unit 440 does not supply the chemical C to the substrate M.

After the preset time elapses, the vision member 4620 images a surface of the liquid film CC formed on the substrate M. The chemical C flowing on the surface of the liquid film CC may be detected based on a surface state of the substrate M imaged by the vision member 4620. If the flow of the chemical C in the liquid film CC is detected again, the vision member 4620 may determine that the vibration is applied to the substrate M to generate the vibration in the liquid film CC. The vision member 4620 may detect the flow amount of the chemical C and convert the detected flow amount into a vibration value. If the vibration value detected by the vision member 4620 exceeds a limit range again, the controller 30 generates an alarm signal for the substrate treating apparatus 1 and interlocks it.

On the contrary, after the preset time has elapsed, the vision member 4620 may determine that the vibration applied to the substrate M has been removed if the flow of the chemical C is not detected in the liquid film CC. Accordingly, the vision member 4620 may determine that the vibration state generated in the liquid film CC is resolved. The controller 30 may generate a control signal for performing a progress command so that the substrate treating apparatus 1 performs the post-treating step S43 to be described later. Accordingly, the post-treating step S43 to be described later on the substrate M is performed.

Figure 15:
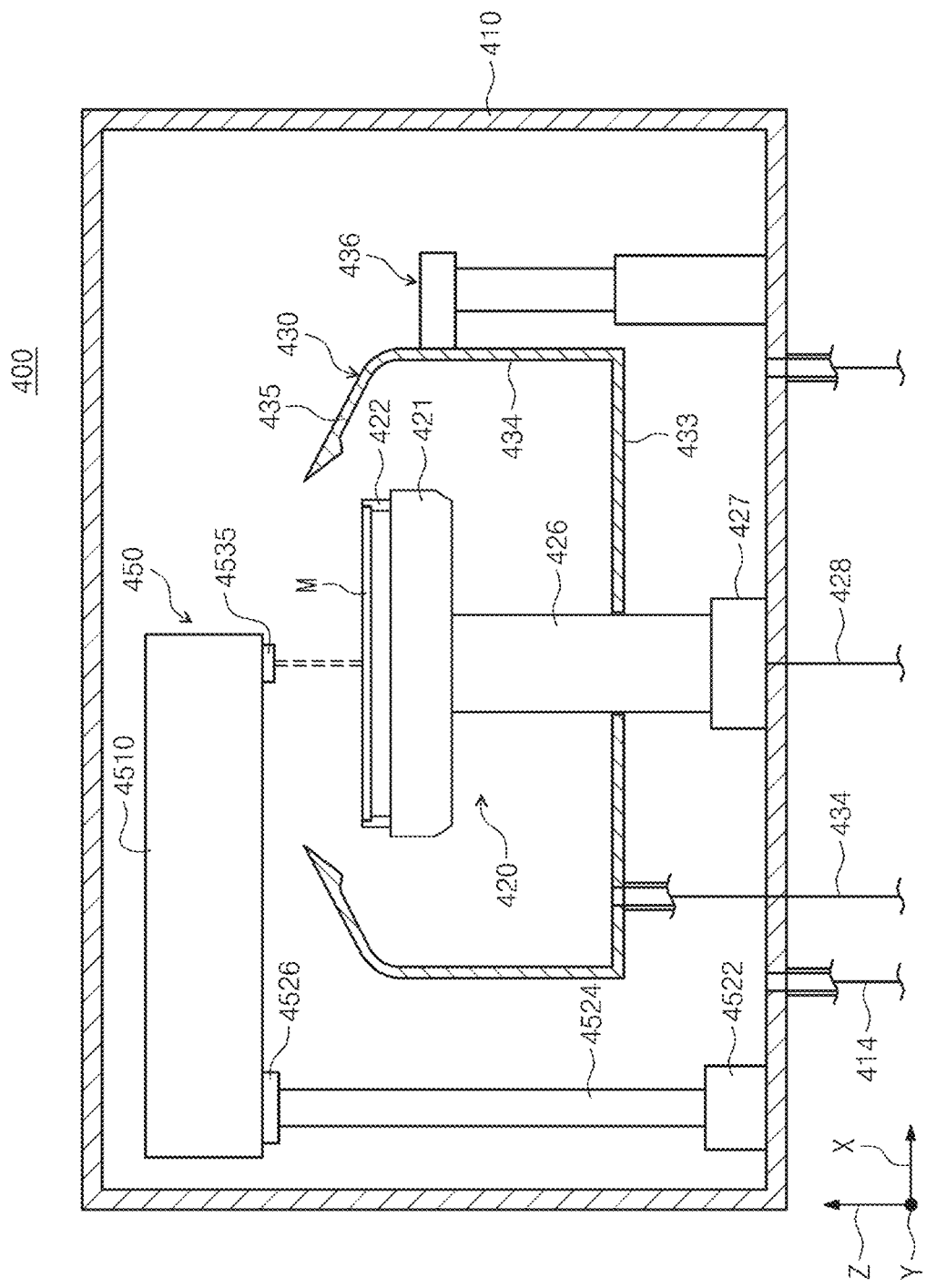
FIG. 15 illustrates the substrate treating apparatus performing the post-treating step of FIG. 10.

FIG. 15 illustrates a state of the substrate treating apparatus for performing a post treating step of FIG. 10. Referring to FIG. 15, in the heating step S42, the substrate M may be heated by irradiating the laser light L to the substrate M. For example, in the heating step S42, the irradiation module 450 can heat the substrate M on which a liquid film is formed by irradiating the laser light L to the substrate M. In the heating step S42, the laser light L may be irradiated to a specific region of the substrate M. A temperature of the specific region of the substrate M to which the laser light L is irradiated may be increased. Accordingly, an etching amount by the chemical C at the region to which the laser light L is irradiated may increase.

In the heating step S42, the laser light L may be irradiated to any one of the first pattern P1 or the second pattern P2. For example, the laser light L may be irradiated only to the second pattern P2 among the first pattern P1 and the second pattern P2. Accordingly, an etching ability of the chemical C with respect to the second pattern P2 is improved. Accordingly, a critical dimension of the first pattern P1 may be changed from a first width (e.g., 69 nm) to a target critical dimension (e.g., 70 nm). Also, a critical dimension of the second pattern P2 may be changed from a second width (e.g., 68.5 nm) to the target critical dimension (e.g., 70 nm). That is, it is possible to minimize a critical dimension deviation of the pattern formed on the substrate M by improving the etching ability with respect to some regions of the substrate M.

Figure 16:
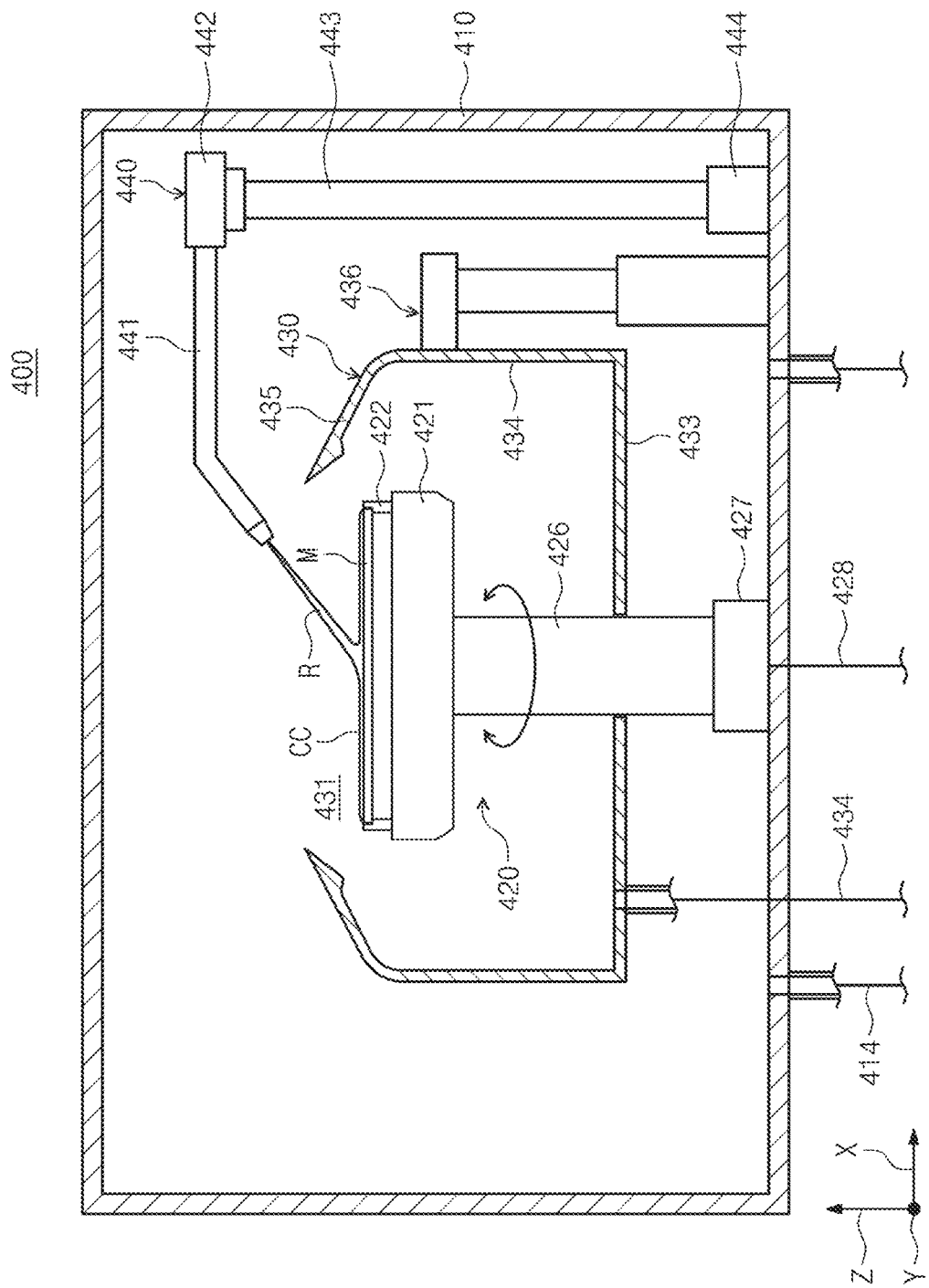
FIG. 16 illustrates the substrate treating apparatus performing a rinsing step of FIG. 10.

FIG. 16 illustrates the substrate treating apparatus which performs a rinsing step of FIG. 10. Referring to FIG. 16, in the rinsing step S50, process by-products generated in the etching step S40 are removed from the substrate M. In the rinsing step S50, a rinsing liquid R may be supplied to a rotating substrate M. The rinsing liquid R may be supplied to the substrate M to remove process by-products formed on the substrate M. In order to dry a rinsing liquid R remaining on the substrate M as necessary, the support unit 420 may rotate the substrate M at a high speed to remove the rinsing liquid R remaining on the substrate M.

In the substrate taking-out step S60, the substrate M which has been treated may be taken out from an inner space 412. In the substrate taking-out step S60, a door (not shown) may open an in/out gateway (not shown) formed at the housing 410. In addition, in the substrate taking-out step S60, a transfer robot 320 may unload the substrate M from the support unit 420 and take an unloaded substrate M out of the inner space 412.

If a specific pattern (e.g., a second pattern P2) formed on the substrate M is heated by using a laser light on the substrate M on which the liquid film CC is formed, a shape of the liquid film CC formed on the substrate M is important. Specifically, a surface shape of the liquid film CC formed on the substrate M determines a refractive angle of the laser light L incident in the pattern formed on the substrate M. Accordingly, a uniform formation of a shape of the liquid film CC formed on the surface of the substrate M acts as a very important factor in finely etching the specific pattern. A uniformity of the liquid film CC formed on the surface of the substrate M may be changed by a vibration transferred to the substrate M. For example, if the support unit 420 supporting the substrate M is shaken, a magnitude of the vibration transmitted from the support unit 420 to the substrate M increases accordingly. In this case, the vibration is also transmitted to the liquid film CC formed on the substrate M to change the surface shape of the liquid film CC. As a result, the vibration transmitted to the liquid film CC makes it difficult to accurately etch the specific pattern when irradiating the laser light L with the substrate M on which the liquid film CC is formed.

According to an embodiment of the inventive concept described above, it is possible to detect the magnitude of the vibration applied to the liquid film CC formed on the substrate M and/or whether the vibration has occurred from the state of the chemical C flowing on the surface of the substrate M supported by the support unit 420 using the vision member 4620. From the magnitude of the vibration applied to the liquid film CC, it is possible to prevent the post-treating step S43 of irradiating the laser light L toward the substrate M while the liquid film CC is vibrating. Accordingly, it is possible to perform a precise etching of the specific pattern of the substrate M by preventing the laser light L from being irradiated to the specific pattern region of the substrate M at which the liquid film CC with a low uniformity is formed. That is, according to an embodiment of the inventive concept, if the laser light L is irradiated on a specific pattern by post-treating the substrate M while the liquid film CC formed on the substrate M has a good uniformity, the laser light L can be irradiated by precisely targeting only the specific pattern.

Other embodiments of the inventive concept described below are mostly provided similar to the substrate treating apparatus and substrate treating method according to an embodiment of the inventive concept, except for cases further described. Accordingly, hereinafter, a description of overlapping configurations will be omitted for convenience of description.

Figure 17:
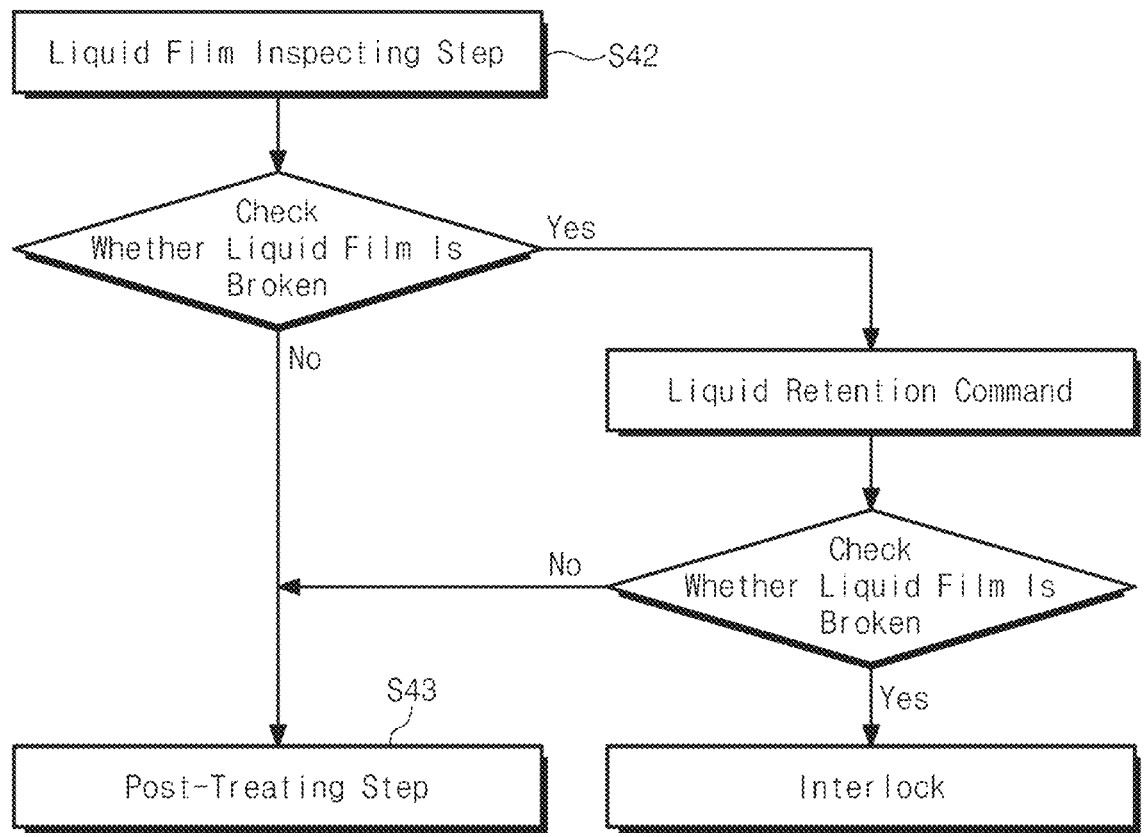
FIG. 17 is a flowchart illustrating another embodiment of the liquid film inspecting step of FIG. 10.

FIG. 17 is a flowchart illustrating another embodiment of the liquid film inspecting step of FIG. 10. Referring to FIG. 17, the vision member 4620 according to an embodiment of the inventive concept may detect a state of the liquid film CC formed on the substrate M. The vision member 4620 may detect a state of the liquid film CC formed by the chemical C supplied from the liquid supply unit 440 to the substrate M. According to an embodiment of the inventive concept, the vision member 4620 may image a surface of the liquid film CC formed on the substrate M. The vision member 4620 may detect whether the boundary surface of the liquid film CC is generated from the imaged surface of the liquid film CC. The vision member 4620 may detect a broken state of the liquid film CC from whether the boundary surface of the liquid film CC occurs or not.

For example, if a boundary surface is not detected on a surface of the liquid film CC, the vision member 4620 may determine that the liquid film CC does not break. The controller 30 may generate a control signal for performing a progress command such that the substrate treating apparatus 1 performs the post-treating step S43. Accordingly, the post-treating step S43 is performed on the substrate M.

Unlike the above description, if the boundary surface is detected in the liquid film CC, the vision member 4620 may determine that the liquid film CC is broken. The vision member 4620 may transmit a data signal that the liquid film CC is in a broken state to the controller 30. If it is determined that the liquid film CC is in a broken state, the controller 30 may generate a control signal to the liquid supply unit 440 to perform a liquid retention command for supplying the chemical C to the substrate M.

The liquid supply unit 440 receiving the control signal corresponding to the liquid retention command may further supply the chemical C to the substrate M supported by the support unit 420 for the set time. For example, the set time may be up to 5 minutes. While the liquid supply unit 440 executes the liquid retention command, the amount of the chemical C supplied to the substrate M may be supplied in an amount in which the chemical C supplied on the substrate M may form a puddle. For example, the liquid supply unit 440 may supply the chemical C from a top surface of the substrate M supported by the support unit 420 to a set height H.

After a preset time elapses, the vision member 4620 re-images the surface of the liquid film CC formed on the substrate M. Based on the surface state of the substrate M imaged by the vision member 4620, the vision member 4620 detects again whether the boundary surface occurs on the surface of the liquid film CC. If it is detected that the boundary surface is generated again on the surface of the liquid film CC, the vision member 4620 may determine that the substrate M is broken. The controller 30 generates an alarm signal for the substrate treating apparatus 1 and interlocks the alarm signal.

On the contrary, after the preset time has elapsed, the vision member 4620 may re-image the surface of the liquid film CC formed on the substrate M and determine that the broken state of the liquid film CC formed on the substrate M has been resolved if it is detected that the boundary surface of the liquid film CC does not occur. The controller 30 may generate a control signal for performing a progress command such that the substrate treating apparatus 1 performs post-treating step S43. Accordingly, the post-treating step S43 is performed on the substrate M.

According to an embodiment of the inventive concept described above, it is possible to detect whether the boundary surface of the liquid film CC is formed from the state of the chemical C flowing on the surface of the substrate M supported by the support unit 420 using the vision member 4620. Accordingly, it is possible to detect whether the liquid film CC formed on the substrate M is in a broken state. The laser light L is irradiated to a region at which the liquid film CC breaks, and the laser light L is refracted to prevent an unintended region from being etched. Accordingly, it is possible to perform a precise etching of a specific pattern of the substrate M by preventing the laser light L from being irradiated to a specific pattern region of the substrate M at which the liquid film CC with a low uniformity is formed. That is, according to an embodiment of the inventive concept, if the laser light L is irradiated on a specific pattern by post-treating the substrate M while the liquid film CC formed on the substrate M has a good uniformity, the laser light L can be irradiated by precisely targeting only a specific pattern.

Figure 18:
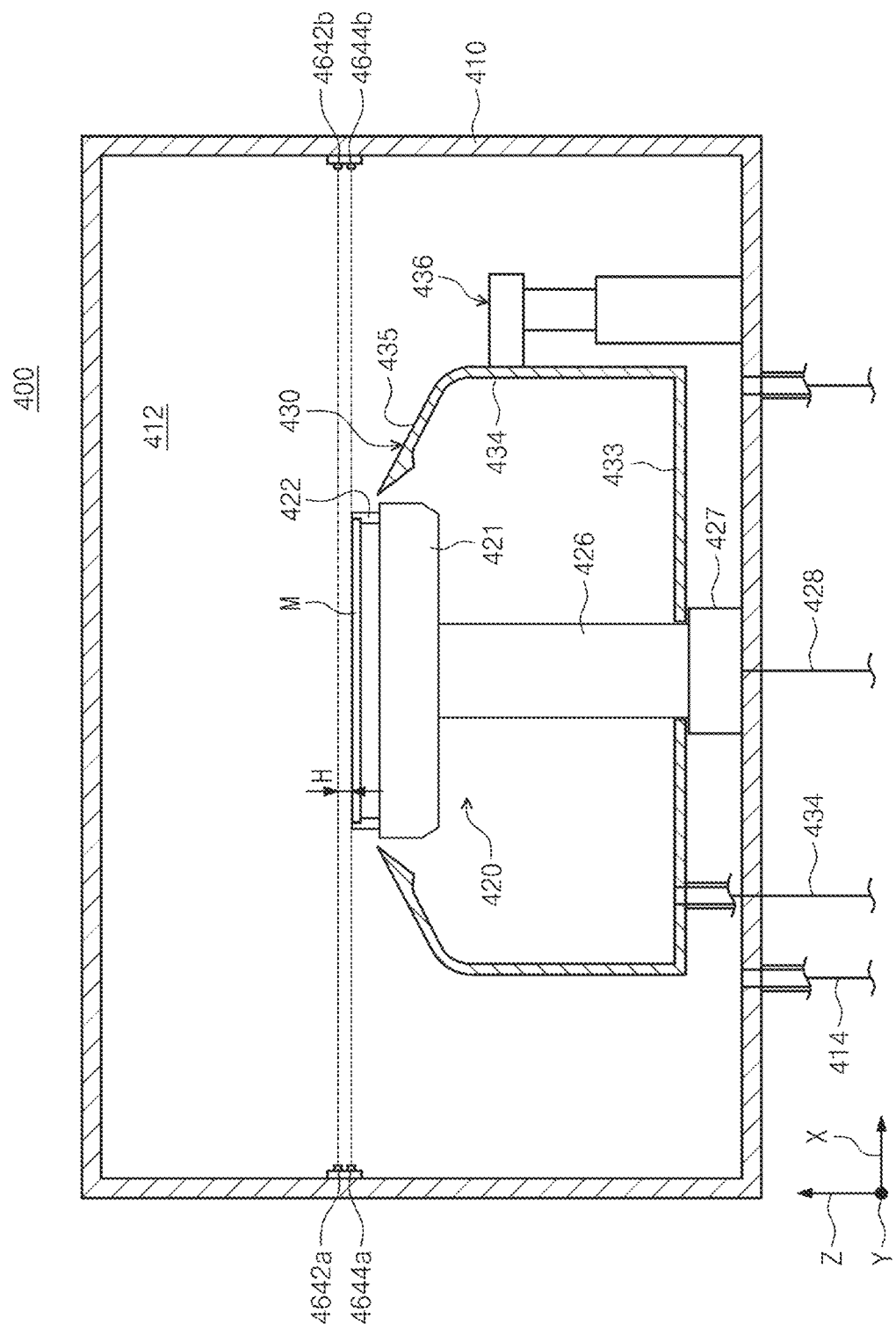
FIG. 18 schematically illustrates another embodiment of the liquid treating chamber of FIG. 2.

FIG. 18 schematically illustrates another embodiment of the liquid treating chamber of FIG. 2. The liquid treating chamber in accordance with other embodiments of the inventive concept described below are similarly provided except for the monitoring unit 460 in the configuration for the liquid treating chamber described above. Accordingly, the description of the overlapping configuration will be omitted for convenience of description.

Referring to FIG. 18, the monitoring unit 460 may monitor the substrate M supported by the support unit 420. The monitoring unit 460 may monitor the state of the liquid film CC formed on the substrate M supported by the support unit 420. The state of the liquid film CC of the substrate M sensed by the monitoring unit 460 may be transmitted to the controller 30. The monitoring unit 460 according to an embodiment may detect whether the liquid film CC is formed and/or the thickness of the liquid film CC among the state of the liquid film CC. The monitoring unit 460 may include a top light sensor 4642 and a bottom light sensor 4644.

The top light sensor 4642 may detect the thickness of the liquid film CC. The top light sensor 4642 may be provided in a pair. The top light sensor 4642 may include a first light emitting unit 4642a for irradiating a light and a first light receiving unit 4642b for receiving the light. The top light sensor 4642 may be installed on a sidewall of the housing 410. The top light sensor 4642 may be disposed above the bottom light sensor 4644 to be described later. The top light sensor 4642 may be installed at a position corresponding to a set height H among a sidewall of the housing 410. The set height H may be a height of the liquid film CC formed by supplying the chemical C from a top surface of the substrate M supported by the support unit 420. If the thickness of the liquid film CC formed on the substrate M is detected by the top light sensor 4642, the treating container 430 may be lowered by the lifting/lowering member 436.

The bottom light sensor 4644 may detect whether the liquid film CC is formed. A pair of bottom light sensors 4644 may be provided. The bottom light sensor 4644 may include a second light emitting unit 4644a for irradiating light and a second light receiving unit 4644b for receiving light. The bottom light sensor 4644 may be installed on a sidewall of the housing 410. The bottom light sensor 4644 may be disposed below the top light sensor 4642. The bottom light sensor 4644 may be installed between a top surface of the substrate M and a set height H among sidewalls of the housing 410. The bottom light sensor 4644 may be installed at a height adjacent to a top surface of the substrate M supported by the support unit 420 when viewed from the front. When detecting the presence or absence of the liquid film CC formation of the substrate M by the bottom light sensor 4644, the treating container 430 may be lowered by the lifting/lowering member 436. For example, a virtual straight line connecting the second light emitting unit 4644a and the second light receiving unit 4644b may be positioned above the top end of the treating container 430 when viewed from the front. In addition, a virtual straight line connecting the second light emitting unit 4644a and the second light receiving unit 4644b may be positioned above the top surface of the substrate M.

Figure 19:
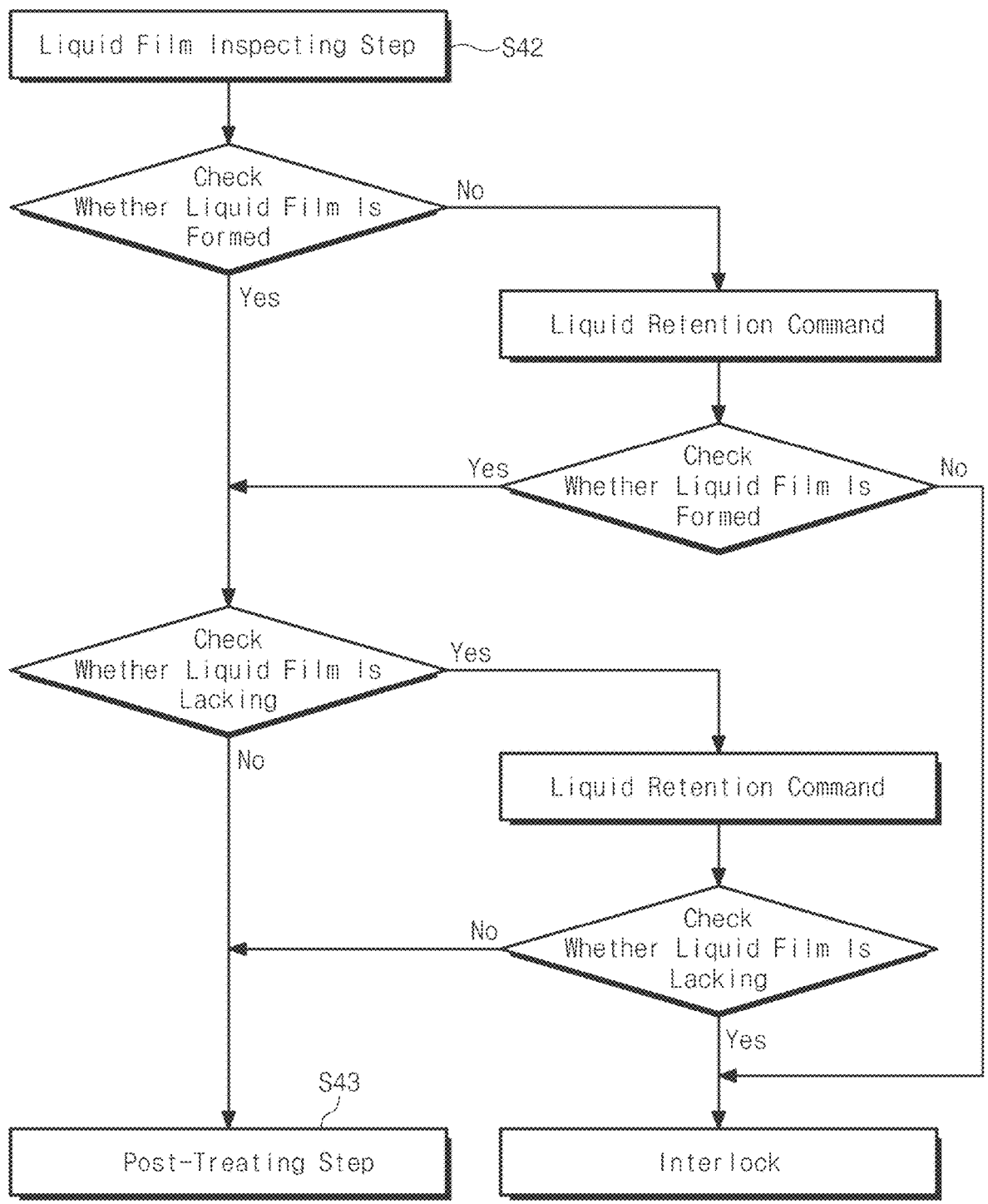
FIG. 19 is a flowchart illustrating another embodiment of performing the liquid film inspecting step in the liquid treating chamber of FIG. 18.

FIG. 19 is a flowchart illustrating another embodiment of performing a liquid film inspecting step in the liquid treating chamber of FIG. 18. Referring to FIG. 19, the bottom light sensor 4644 according to an embodiment of the inventive concept may identify whether a liquid film CC is formed. Before detecting whether the liquid film CC is formed by the bottom light sensor 4644, the controller 30 can lower and move the treating container 430 by controlling the lifting/lowering member 436. The bottom light sensor 4644 is disposed at a height adjacent to the top surface of the substrate M supported by the support unit 420 to detect whether the chemical C supplied on the substrate M forms a liquid film CC. For example, the second light emitting unit 4644a irradiates light toward the second light receiving unit 4644b. In this case, the top end of the treating container 430 is positioned below a virtual straight line connecting the second light emitting unit 4644a and the second light receiving unit 4644b. For example, after the treating container 430 is lowered and moved by the lifting/lowering member 436, the top end of the treating container 430 may be positioned below the top surface of the substrate M.

If light is not received in the second light receiving part 4644b, the monitoring unit 460 may determine that the liquid film CC is formed on the substrate M. In this case, the controller 30 may generate a control signal to perform a step of checking whether a liquid film is insufficient by the top light sensor 4642, which will be described later.

When light is received in the second light receiving part 4644b, the monitoring unit 460 may determine that the liquid film CC is not formed on the substrate M. The monitoring unit 460 may transmit a data signal to the controller 30 that the liquid film CC is not formed. When it is determined that the liquid film CC is not formed, the controller 30 may generate a control signal to the liquid supply unit 440 to perform a liquid retention command for supplying chemical C to the substrate M.

Upon receiving the control signal corresponding to the retention command, the liquid supply unit 440 may supply the chemical C again to the substrate M supported by the support unit 420 for a set time. For example, the set time may be up to 5 minutes. While the liquid supply unit 440 executes the retention command, the amount of chemical C supplied to the substrate M may be supplied in an amount in which the chemical C supplied on the substrate M may form a puddle. For example, the liquid supply unit 440 may supply the chemical C from the top surface of the substrate M supported by the support unit 420 to a set height H.

After a preset time elapses, the second light emitting unit 4644a irradiates light again toward the second light receiving unit 4644b. When the light irradiated from the second light emitting unit 4644a is received by the second light receiving unit 4644b, the monitoring unit 460 may determine that the liquid film CC is not formed on the substrate M. In this case, the controller 30 generates and interlocks an alarm signal with respect to the substrate treating apparatus 1. Accordingly, the operator may perform a maintenance operation on the substrate treating apparatus 1 by determining that an abnormality has occurred in the liquid supply unit 440.

In contrast, if the light irradiated from the second light-emitting unit 4644a is not received by the second light-receiving unit 4644b after a preset time has elapsed, the monitoring unit 460 may determine that a liquid film CC is formed on the substrate M. In this case, the controller 30 may generate a control signal for performing a progress command so that the substrate treating apparatus 1 performs a liquid film shortage checking step described later. Accordingly, a step of checking whether a liquid film is insufficient by the top light sensor 4642 to be described later is performed.

Figure 20:
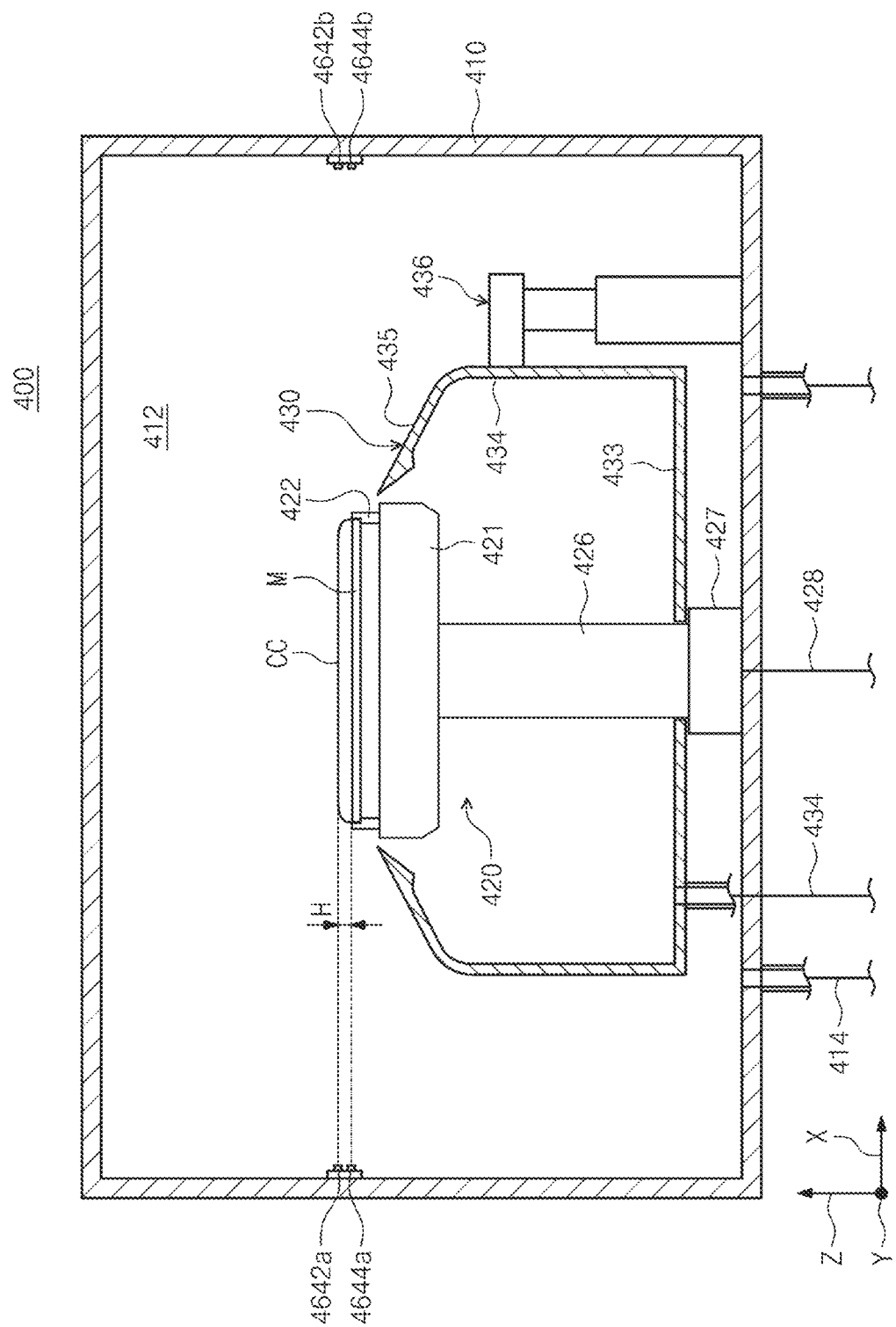
FIG. 20 schematically illustrates the substrate treating apparatus for determining a thickness of the liquid film in the liquid film inspecting step of FIG. 19.
Figure 21:
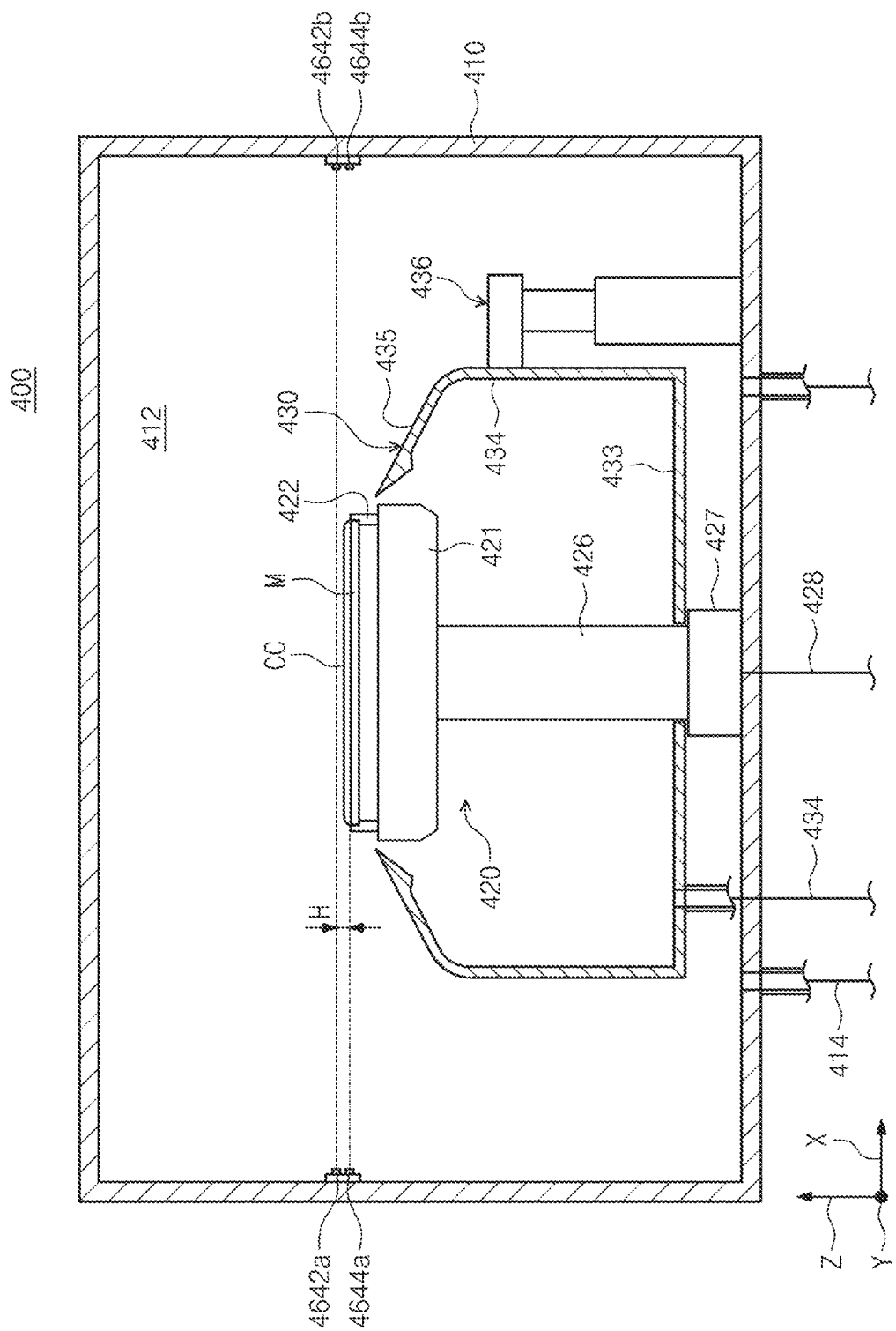
FIG. 21 schematically illustrates the substrate treating apparatus for determining that the thickness of the liquid film is in an abnormal state in the liquid film inspecting step of FIG. 19.
Figure 22:
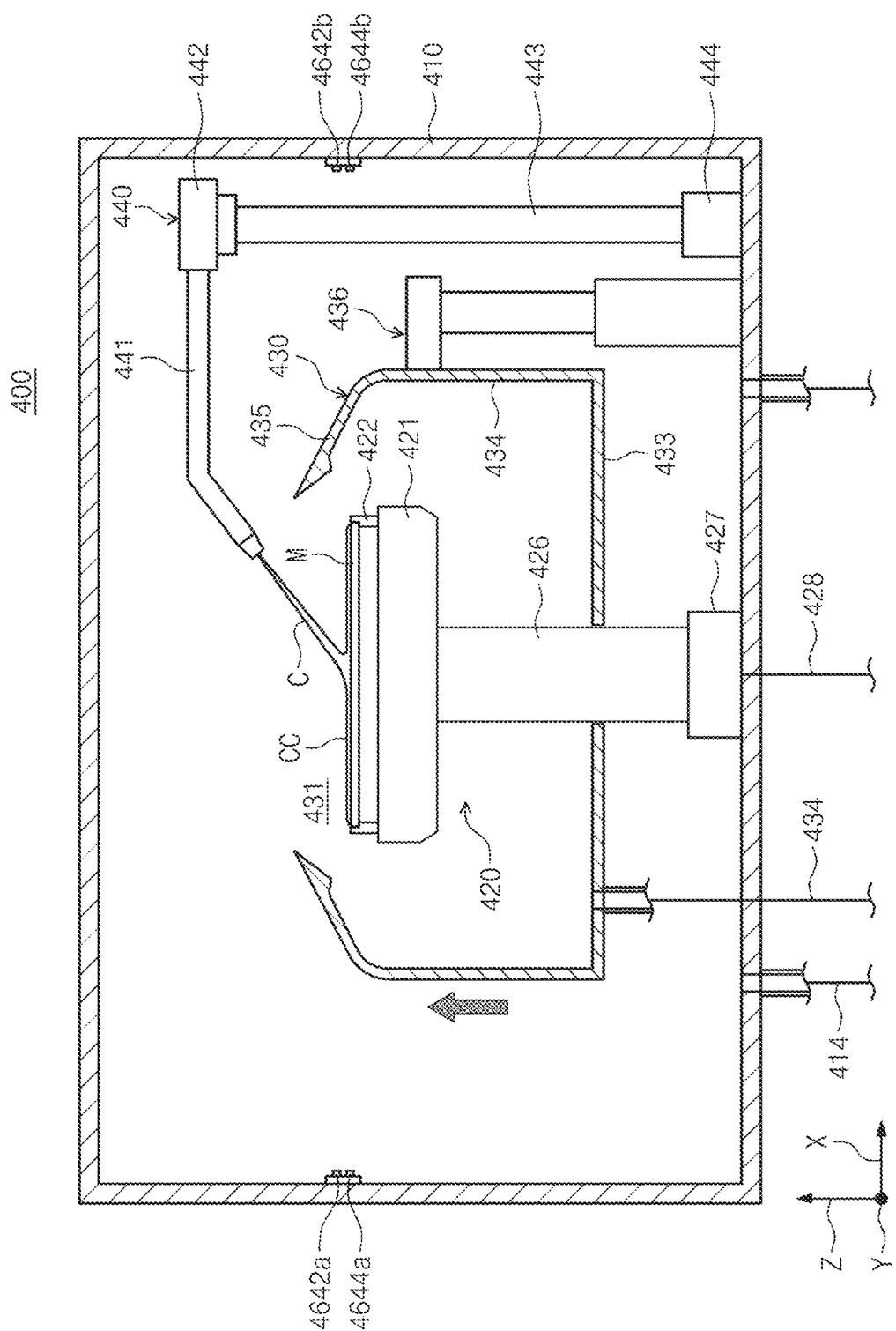
FIG. 22 schematically illustrates a state of a substrate treating apparatus that executes a liquid retention command after determining that the thickness of the liquid film is in an abnormal state in FIG. 21.

FIG. 20 schematically illustrates the substrate treating apparatus for determining a thickness of the liquid film in the liquid film inspecting step of FIG. 19. FIG. 21 schematically illustrates the substrate treating apparatus for determining that the thickness of the liquid film is in an abnormal state in the liquid film inspecting step of FIG. 19. FIG. 22 schematically illustrates the substrate treating apparatus which performs a liquid retention command after determining that the thickness of the liquid film is in an abnormal state in FIG. 21. Hereinafter, a mechanism by which the top light sensor 4642 detects an appropriate thickness of the liquid film CC formed on the substrate M will be described in detail with reference to FIG. 20 to FIG. 22.

The top light sensor 4642 according to an embodiment of the inventive concept may detect the thickness of the liquid film CC. According to one embodiment, if the liquid film CC is formed from the top surface of the substrate M to the set height H, the set height H may be determined as the appropriate thickness of the liquid film CC. When viewed from the front, the top light sensor 4642 may be installed on the sidewall of the housing 410 at a height corresponding to a virtual straight line horizontally from the top surface of the substrate M to the set height H. Accordingly, the top light sensor 4642 may detect the thickness of the liquid film CC formed by the chemical C supplied from the top surface of the substrate M supported by the support unit 420 to the set height H. That is, the top light sensor 4642 may detect an appropriate thickness of the liquid film CC. Before the top light sensor 4642 detects the proper thickness of the liquid film CC formed on the substrate M, the controller 30 may control the lifting/lowering member 436 to lower and move the treating container 430. The top end of the treating container 430 may be positioned below the set height H.

As shown in FIG. 20, the first light emitting unit 4642a irradiates the light toward the first light receiving unit 4642b. If no light is received in the first light receiving unit 4642b, the monitoring unit 460 may determine that the thickness of the liquid film CC formed on the substrate M is formed to an appropriate thickness. The monitoring unit 460 may transmit a data signal that the thickness of the liquid film CC formed on the substrate M is good to the controller 30. The controller 30 may generate a control signal for performing a progress command such that the substrate treating apparatus 1 performs the post-treating step S43. Accordingly, the post-treating step S43 is performed on the substrate M.

Unlike the above-described description and like FIG. 21, if the light is received by the first light receiving unit 4642b, the monitoring unit 460 may determine that the thickness of the liquid film CC formed on the substrate M does not satisfy an appropriate thickness. The monitoring unit 460 may transmit a data signal to the controller 30 that the thickness state of the liquid film CC is not good. When it is determined that the thickness of the liquid film CC is not in a good state, the controller 30 may generate a control signal to the liquid supply unit 440 to perform a liquid retention command for supplying the chemical C to the substrate M.

As shown in FIG. 22, the liquid supply unit 440 receiving the control signal corresponding to the liquid retention command may supply the chemical C again to the substrate M supported by the support unit 420 for a set time. For example, the set time may be up to 5 minutes. While the liquid supply unit 440 executes the retention command, the amount of chemical C supplied to the substrate M may be supplied in an amount in which the chemical C supplied on the substrate M may form a puddle. For example, the liquid supply unit 440 may supply the chemical C from the top surface of the substrate M supported by the support unit 420 to a set height H.

After a preset time elapses, the first light emitting unit 4642a irradiates the light again toward the first light receiving unit 4642b. If the light irradiated from the first light emitting unit 4642a is received by the first light receiving unit 4642b, the monitoring unit 460 may determine that the thickness of the liquid film CC formed on the substrate M is not formed to an appropriate thickness. In this case, the controller 30 generates and interlocks an alarm signal with respect to the substrate treating apparatus 1. Accordingly, the operator may perform a maintenance operation on the substrate treating apparatus 1 by determining that an abnormality has occurred in the liquid supply unit 440.

In contrast, if the light irradiated from the first light-emitting unit 4642a is not received by the first light-receiving unit 4642b after a preset time has elapsed, the monitoring unit 460 may determine that the thickness of the liquid film CC formed on the substrate M is formed to an appropriate thickness. In this case, the controller 30 may generate a control signal for performing a progress command such that the substrate treating apparatus 1 performs the post-treating step S43. Accordingly, the post-treating step S43 is performed on the substrate M.

While a specific pattern formed on the substrate M is heated by irradiating the laser light L or the like to the substrate M on which the liquid film CC is formed, the liquid film CC may be vaporized by the laser light L or the like. In this case, the thickness of the liquid film CC formed on the substrate M gradually decreases, and the reduced thickness of the liquid film may increase an amount of energy transferred to a specific pattern of the substrate M by the laser light L. Accordingly, the etching characteristics of the etchant with respect to the substrate M may be changed.

According to an embodiment of the inventive concept described above, the state of the liquid film CC formed by the chemical C supplied to the support unit 420 may be monitored using the monitoring unit 460. The bottom light sensor 4644 according to an embodiment may accurately detect whether the chemical C supplied to the substrate M forms the liquid film CC. Accordingly, a damage to the pattern formed on the substrate M can be prevented in advance by performing a heat treatment on the substrate M without the liquid film CC formed on the substrate M.

In addition, the top light sensor 4642 according to an embodiment can accurately detect whether the liquid film CC formed on the substrate M is formed to a thickness suitable for a post-treatment. The required thickness of the liquid film CC formed on the substrate M may be accurately detected, and a fluid retention operation may be carried out if the liquid film CC does not reach an appropriate thickness. Accordingly, it is possible to minimize a change in the etching characteristics of the etchant by forming an appropriate thickness of the liquid film CC in consideration of a vaporization by the laser light L during the post-treatment on the substrate M. As a result, if a post-treatment is carried out after irradiating the laser light L with respect to a specific pattern, the specific pattern can be precisely targeted to irradiate the laser light L.

In an embodiment of the inventive concept described above, it is described as an example it is detected whether the liquid film CC is formed by the bottom light sensor 4644 and then a thickness of the liquid film CC is detected by the top light sensor 4642, but the inventive concept is not limited thereto. For example, a detection of the formation of the liquid film CC by the bottom light sensor 4644 and a detection of a set thickness of the liquid film CC by the top light sensor 4642 may be performed simultaneously.

Figure 23:
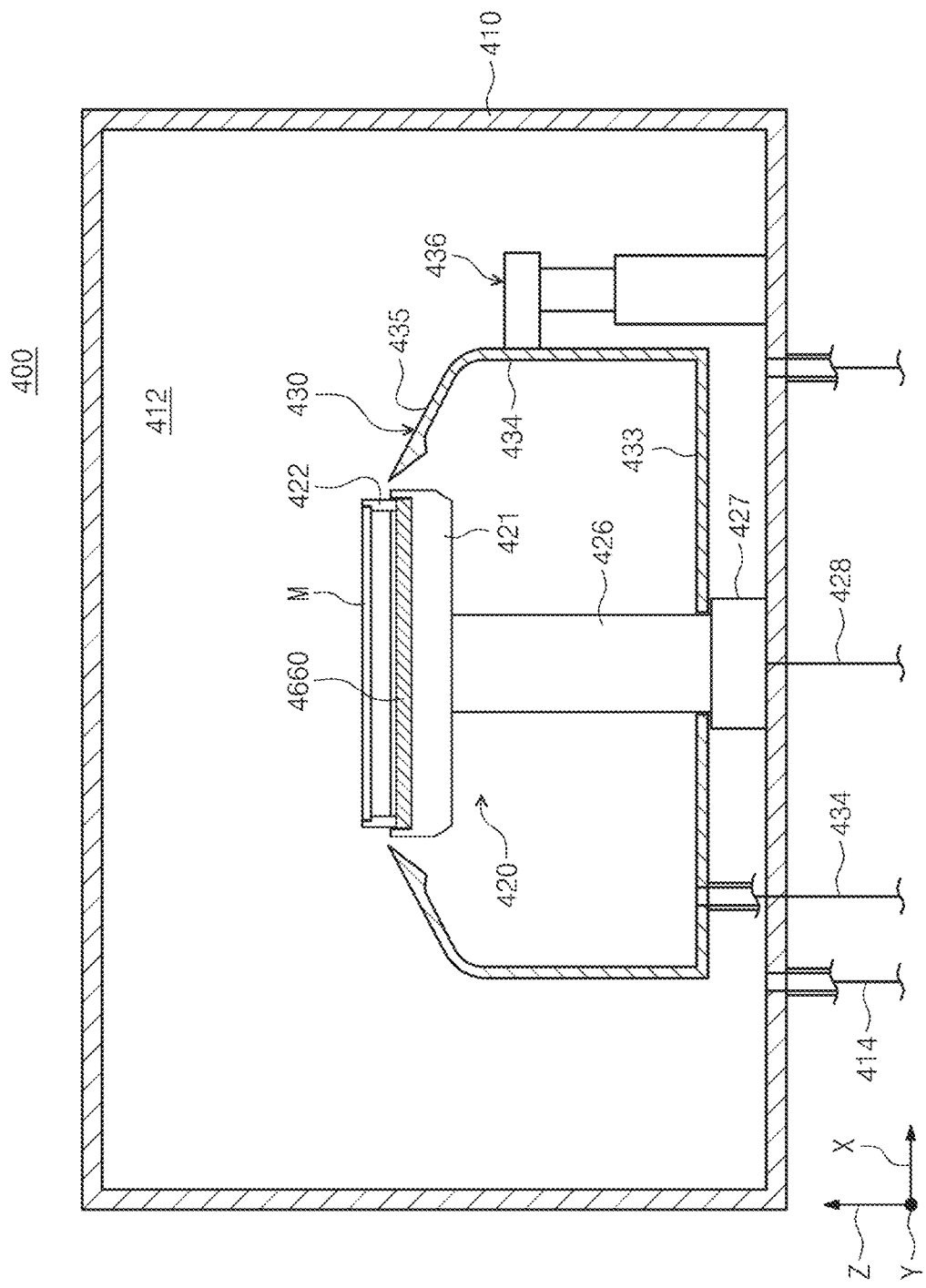
FIG. 23 schematically illustrates another embodiment of the liquid treating chamber of FIG. 2.

FIG. 23 schematically illustrates another embodiment of the liquid treating chamber of FIG. 2. The liquid treating chamber of another embodiment of the inventive concept described below is similarly provided to the configuration for the liquid treating chamber described above except for the monitoring unit 460. Accordingly, the description of the overlapping configuration will be omitted for a convenience of description.

Referring to FIG. 23, the monitoring unit 460 may monitor the substrate M supported by the support unit 420. The monitoring unit 460 may monitor the state of the liquid film CC formed on the substrate M supported by the support unit 420. The state of the liquid film CC of the substrate M sensed by the monitoring unit 460 may be transmitted to the controller 30. The monitoring unit 460 according to an embodiment may detect a weight of the liquid film CC among a state of the liquid film CC. An appropriate thickness of the liquid film CC may be detected based on the weight of the liquid film CC detected by the monitoring unit 460. Accordingly, the monitoring unit 460 according to an embodiment may be provided as a weight measuring member 4660 for measuring a weight.

The weight measuring member 4660 may be installed in the support unit 420. The weight measuring member 4660 may be installed inside the body 421. The weight measuring member 4660 may be connected to one end of the support pin 422 inside the body 421. The weight measuring member 4660 is connected to the support pin 422 and can measure the weight of the substrate M and/or the chemical C supplied to the substrate M transmitted from the support pin 422. For example, when the chemical C is supplied to the substrate M, the weight measuring member 4660 may measure the total weight obtained by adding the weight of the substrate M and the weight of the chemical C supplied to the substrate M.

Figure 24:
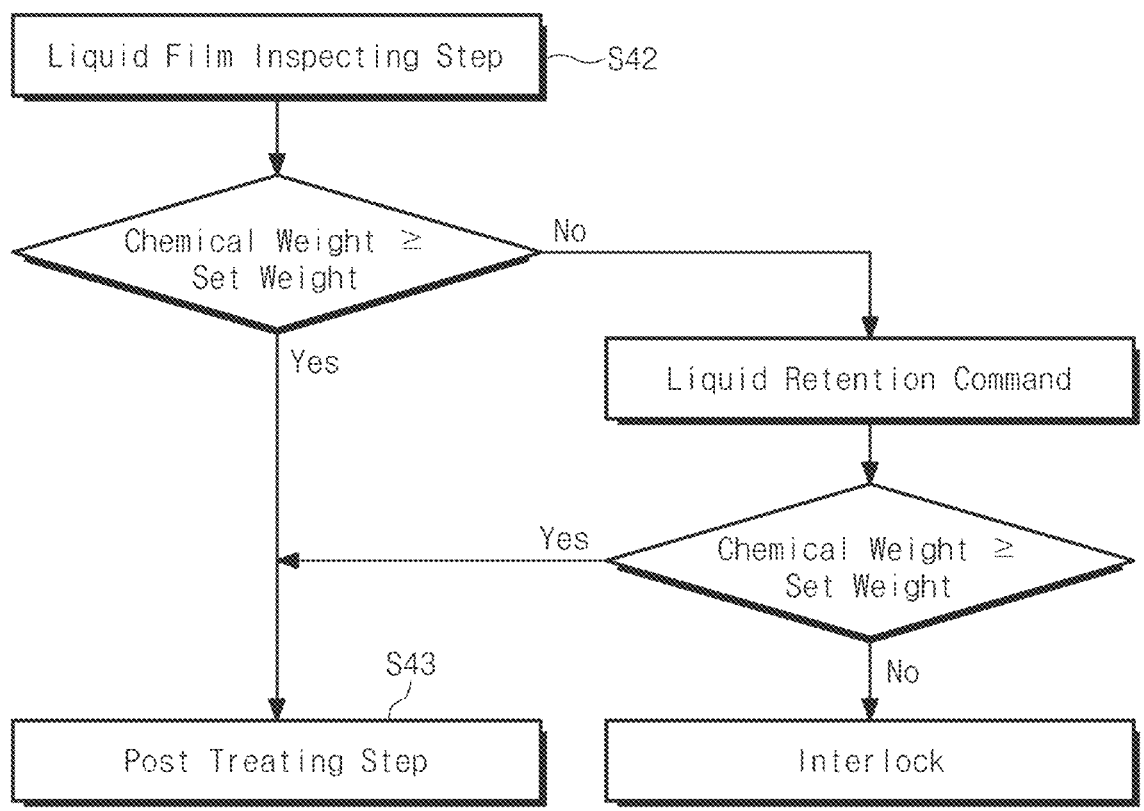
FIG. 24 is a flowchart illustrating another embodiment of performing a liquid film inspecting step in the liquid treating chamber of FIG. 23.

FIG. 24 is a flowchart illustrating another embodiment of performing a liquid film inspecting step in the liquid treating chamber of FIG. 23. Referring to FIG. 24, the weight measuring member 4660 according to an embodiment of the inventive concept may measure the weight of a chemical C supplied on the substrate M. For example, the weight measuring member 4660 may measure a combined weight of the chemical C supplied to the substrate M and a weight of the substrate M in the liquid treating step S42. The weight measuring member 4660 may transmit a data on a measured combined weight to the controller 30. The controller 30 may store a weight data of a pure substrate M on which a substance such as the chemical C is not supplied. In addition, the controller 30 may store the weight data of the chemical C suitable for performing the post-treating step S43.

The controller 30 excludes a net weight value of a pre-stored substrate M from a total weight transmitted from the weight measuring member 4660. Accordingly, the controller 30 may measure the weight of the chemical C supplied to the substrate M.

If the weight of the measured chemical C corresponds to the weight of the preset chemical C, the controller 30 may determine that an amount of the chemical C supplied to the substrate M is within an appropriate range. Accordingly, the controller 30 may estimate that the thickness of the liquid film CC formed on the substrate M is within an appropriate thickness range. Accordingly, the controller 30 may generate a control signal for performing a progress command such that the substrate treating apparatus 1 performs the post-treating step S43. Accordingly, the post-treating step S43 is performed on the substrate M.

In contrast, if the weight of the measured chemical C is lower than the weight of the preset chemical C, the controller 30 may determine that the amount of the chemical C supplied onto the substrate M is insufficient. In addition, the controller 30 may determine that the liquid film CC formed on the substrate M has not reached an appropriate thickness if it is determined that the amount of chemical C supplied is insufficient.

If it is determined that the weight of the chemical C supplied to the substrate M is insufficient, the controller 30 may generate a control signal to the liquid supply unit 440 to perform a liquid retention command for supplying the chemical C to the substrate M.

The liquid supply unit 440 receiving the control signal corresponding to the liquid retention command may further supply the chemical C to the substrate M supported by the support unit 420 for a set time. For example, the set time may be up to 5 minutes. While the liquid supply unit 440 executes the liquid retention command, the amount of the chemical C supplied to the substrate M may be supplied in an amount in which the chemical C supplied on the substrate M may form a puddle. For example, the liquid supply unit 440 may supply the chemical C from a top surface of the substrate M supported by the support unit 420 to a set height H.

After a preset time elapses, the weight measuring member 4660 measures the weight of the chemical C again. Based on the weight of the chemical C measured by the weight measuring member 4660, the controller 30 detects again whether the thickness of the liquid film CC formed on the substrate M meets the appropriate thickness. If it is determined that the thickness of the liquid film C does not meet the appropriate thickness, the controller 30 generates and interlocks an alarm signal for the substrate treating apparatus 1.

On the other hand, after the present time has passed, if the weight measured by the weight measuring member 4660 corresponds to the weight of the preset chemical C, the controller 30 may determine that the thickness of the liquid film CC formed on the substrate M is within an appropriate thickness range. Accordingly, the controller 30 may generate a control signal for performing a progress command such that the substrate treating apparatus 1 performs the post-treating step S43. Accordingly, the post-treating step S43 is performed on the substrate M.

In accordance with an embodiment of the inventive concept, it is possible to accurately detect whether the liquid film CC formed on the substrate M is formed to a thickness suitable for a post-treatment. A required thickness of the liquid film CC formed on the substrate M is estimated using the weight of the chemical C supplied on the substrate M, and if the liquid film CC does not reach an appropriate thickness, a fluid retention operation may be performed. Accordingly, it is possible to minimize the change in the etching characteristics of the etchant by forming an appropriate thickness of the liquid film CC in consideration of a vaporization by a laser light L during the post-treatment on the substrate M. As a result, if a post treatment of irradiating the laser light L with respect to a specific pattern is carried out, the laser light L may be irradiated precisely targeting the specific pattern.

In the embodiment of the inventive concept described above, an etching rate of the second pattern P2 is improved at the substrate M having the first pattern P1 which is a monitoring pattern for monitoring an exposing pattern and the second pattern P2 which is a condition setting pattern for treating the substrate. However, unlike this, functions of the first pattern P1 and the second pattern P2 may be different from those of the above-described embodiment of the inventive concept. In addition, according to an embodiment of the inventive concept, only one of the first pattern P1 or the second pattern P2 is provided, and an etching rate of one of the first pattern P1 or the second pattern P2 may be improved. In addition, according to an embodiment of the inventive concept, the same may be applied to improve an etching rate of a specific region on a substrate such as a wafer or a glass other than a photomask.

The effects of the inventive concept are not limited to the above-mentioned effects, and the unmentioned effects can be clearly understood by those skilled in the art to which the inventive concept pertains from the specification and the accompanying drawings.

Although the preferred embodiment of the inventive concept has been illustrated and described until now, the inventive concept is not limited to the above-described specific embodiment, and it is noted that an ordinary person in the art, to which the inventive concept pertains, may be variously carry out the inventive concept without departing from the essence of the inventive concept claimed in the claims and the modifications should not be construed separately from the technical spirit or prospect of the inventive concept.

What is claimed is:

1. A substrate treating apparatus, comprising:
a housing defining a treating space;
a support unit in the treating space and configured to support and rotate a substrate;
a liquid supply unit configured to perform a liquid treatment on the substrate, the liquid treatment including supplying a liquid to the substrate so that a liquid film is formed on the substrate, the liquid film being of the liquid supplied to the substrate;
a post-treating unit configured to perform a post-treatment on the substrate;
a monitoring unit configured to inspect a state of the liquid film; and
a controller configured to generate a control signal for performing a standby command for stopping a driving of the substrate treating apparatus,
wherein the monitoring unit includes a vision member configured to detect a vibration of the liquid film among the state of the liquid film, by detecting a flow of the liquid at a surface of the liquid film, and
the controller is further configured to generate a signal of the standby command to the support unit and to the liquid supply unit so that rotation of the support unit and liquid supply of the liquid supply unit are stopped for a set time, in response to the vision member detecting the vibration of the liquid film.

2. The substrate treating apparatus of claim 1, wherein the controller is further configured to generate a liquid retention command for supplying the liquid onto the substrate, according to a state of the liquid film detected by the monitoring unit.

3. The substrate treating apparatus of claim 1, wherein the vision member is configured to detect whether a boundary surface of the liquid film is generated at the surface of the liquid film, and is further configured to detect a breakage of the liquid film among the state of the liquid film.

4. The substrate treating apparatus of claim 2, wherein the liquid supply unit is configured to supply the liquid to a set height from a top surface of the substrate, and
wherein the monitoring unit comprises
a top light sensor positioned at a height corresponding to the set height, and which is configured to detect a thickness of the liquid film among the state of the liquid film; and
a bottom light sensor positioned between the top surface of the substrate supported on the support unit and the set height, and which is configured to detect whether the liquid film is formed among the state of the liquid film, and
wherein the controller is configured to generate a liquid retention command signal to the liquid supply unit so the liquid supply unit supplies the liquid to the substrate so the thickness of the liquid film is formed to the set height, in response to the thickness of the liquid film being detected by the top light sensor as below the set height.

5. The substrate treating apparatus of claim 2, wherein the monitoring unit includes a weight measuring member positioned within the support unit, and which is configured to detect a weight of the liquid supplied to the substrate.

6. The substrate treating apparatus of claim 1, wherein the post-treating unit is a heating unit configured to heat the substrate supplied with the liquid.

7. The substrate treating apparatus of claim 6, wherein the heating unit is an irradiation module configured to irradiate a laser light to the substrate supplied with the liquid.

8. The substrate treating apparatus of claim 1, wherein the controller is further configured to generate the signal of the standby command during an etching operation of the substrate treatment apparatus.

9. The substrate treating apparatus of claim 1, wherein the controller is further configured to generate the signal of the standby command during the liquid treatment performed by the liquid supply unit.

10. The substrate treating apparatus of claim 1, wherein the liquid supplied by the liquid supply unit is an etchant.

11. The substrate treating apparatus of claim 1, wherein the controller is further configured execute a progress command to the post-treatment unit, in response to the vibration detected by the vision member not exceeding a certain limit range.

12. The substrate treating apparatus of claim 1, wherein the controller is further configured to generate an alarm signal to interlock the substrate treating apparatus, in response to the vibration detected by the vision member exceeding a certain limit range.

13. The substrate treating apparatus of claim 1, wherein the vision member is installed on a sidewall of the housing.

14. A substrate treating apparatus, comprising:
a housing defining a treating space;
a support unit in the treating space and configured to support and rotate a substrate;
a liquid supply unit configured to perform a liquid treatment on the substrate, the liquid treatment including supplying a liquid to the substrate so that a liquid film is formed on the substrate, the liquid film being of the liquid supplied to the substrate;
a post-treating unit configured to perform a post-treatment on the substrate;
a monitoring unit configured to inspect a state of the liquid film; and
a controller configured to generate a control signal for performing a standby command for stopping a driving of the substrate treating apparatus,
wherein the monitoring unit includes a vision member configured to detect a vibration of the liquid film among the state of the liquid film, by detecting a flow of the liquid at a surface of the liquid film,
wherein the controller is further configured to generate a signal of the standby command to the support unit and to the liquid supply unit so that rotation of the support unit and liquid supply of the liquid supply unit are stopped for a first set time, in response to the vision member detecting the vibration of the liquid film, and generate a liquid retention command signal to the liquid supply unit so the liquid is supplied by the liquid supply unit to the substrate supported on the support unit during a second set time, in response to the vision member detecting a boundary surface of the liquid film.

15. A substrate treating apparatus for treating a mask having a plurality of cells, comprising:
a support unit configured to support and rotate the mask having a first pattern within the plurality of cells and having a second pattern, is different from the first pattern, outside a region at which the cells are located;
a liquid supply unit configured to supply a liquid to the mask, the mask being supported on the support unit;
an irradiation module configured to irradiate a laser light to the second pattern among the first pattern and the second pattern at which the liquid is supplied;
a monitoring unit configured to inspect a state of a liquid film of the liquid supplied onto the mask, and
a controller,
wherein the monitoring unit includes a vision member configured to detect a vibration of the liquid film among the state of the liquid film, by detecting a flow of the liquid at a surface of the liquid film,
the controller is configured to generate a standby command for stopping a driving of the substrate treating apparatus, or a liquid retention command for supplying the liquid onto the mask, according to the state of the liquid film detected by the monitoring unit, and
the controller is further configured to generate a signal of the standby command to the support unit and the liquid supply unit so a rotation of the support unit and a liquid supply of the liquid supply unit are stopped for a first set time, in response to the vision member detecting the vibration of the liquid film.

16. The substrate treating apparatus of claim 15, wherein the vision member is configured to detect whether a boundary surface of the liquid film is generated at the surface of the liquid film, and is further configured to detect a breakage of the liquid film among the state of the liquid film, and
the controller is configured to generate a liquid retention command signal to the liquid supply unit so the liquid is supplied by the liquid supply unit to the mask during a second set time, in response to the vision member detecting the boundary surface of the liquid film.

* * * * *